(12) United States Patent
Shiino et al.

(10) Patent No.: US 11,557,356 B2
(45) Date of Patent: Jan. 17, 2023

(54) SEMICONDUCTOR MEMORY DEVICE WITH ERASE VERIFICATION ON MEMORY STRINGS IN A MEMORY BLOCK

(71) Applicant: KIOXIA CORPORATION, Tokyo (JP)

(72) Inventors: Yasuhiro Shiino, Kanagawa (JP); Masahiko Iga, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/187,699

(22) Filed: Feb. 26, 2021

(65) Prior Publication Data
US 2021/0280260 A1 Sep. 9, 2021

(30) Foreign Application Priority Data
Mar. 9, 2020 (JP) .............................. JP2020-040181

(51) Int. Cl.
| | | |
|---|---|---|
| *G11C 16/34* | (2006.01) | |
| *G11C 16/04* | (2006.01) | |
| *G11C 16/26* | (2006.01) | |
| *G11C 16/16* | (2006.01) | |
| *G11C 16/24* | (2006.01) | |
| *G11C 16/08* | (2006.01) | |

(52) U.S. Cl.
CPC ...... *G11C 16/3445* (2013.01); *G11C 16/0483* (2013.01); *G11C 16/08* (2013.01); *G11C 16/16* (2013.01); *G11C 16/24* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 8,169,832 B2 | 5/2012 | Sarin et al. | |
| 8,848,452 B1 | 9/2014 | Haddad | |
| 8,976,597 B2 | 3/2015 | Shiino et al. | |
| 9,236,139 B1* | 1/2016 | Lai | G11C 16/0483 |
| 10,453,542 B2 | 10/2019 | Kim | |
| 2013/0279257 A1* | 10/2013 | Costa | G11C 16/0483 |
| | | | 365/185.17 |
| 2015/0023103 A1* | 1/2015 | Aritome | G11C 16/04 |
| | | | 365/185.12 |
| 2016/0141043 A1* | 5/2016 | Lee | G11C 16/08 |
| | | | 365/185.11 |
| 2016/0225415 A1* | 8/2016 | Lee | G11C 16/3445 |
| 2019/0139615 A1* | 5/2019 | Ku | G11C 16/3445 |

FOREIGN PATENT DOCUMENTS

JP  2012169020 A  9/2012

* cited by examiner

*Primary Examiner* — J. H. Hur
(74) *Attorney, Agent, or Firm* — Kim & Stewart LLP

(57) ABSTRACT

A semiconductor memory device includes a memory block with string units including a plurality of memory strings of memory cell transistors connected in series. Word lines are connected memory cell transistors in a same row and bit lines are respectively connected to one of the memory strings in each string unit. The bit lines are divided into different groups. A control circuit performs erasing on of the memory cell transistors in the memory block. The control circuit executes the erase verification on only a subset of memory strings in each string unit of the memory block rather than all memory strings.

12 Claims, 30 Drawing Sheets

SEMICONDUCTOR MEMORY DEVICE WITH ERASE VERIFICATION ON MEMORY STRINGS IN A MEMORY BLOCK

CROSS-REFERENCE TO RELATED APPLICATION

This application is based upon and claims the benefit of priority from Japanese Patent Application No. 2020-040181, filed Mar. 9, 2020, the entire contents of which are incorporated herein by reference.

FIELD

Embodiments described herein relate generally to a semiconductor memory device.

BACKGROUND

In recent years, semiconductor memory devices, such as NAND type FLASH memory, have started to be made as a three-dimensional, stacked structure due to a demand for miniaturization and larger storage capacities. In NAND type FLASH memory, a memory cell transistor can be configured as a single-level cell (SLC) capable of storing 1-bit data (2 values) or a multi-level cell (MLC) capable of storing 2-bit data (4 values), a triple-level cell (TLC) capable of storing 3-bit data (8 values), or a quad-level cell (QLC) capable of storing 4-bit data (16 values).

Data erasing of such the NAND type FLASH memory is performed in block units, and whether or not the memory cell transistor after the erasing process is in an erase state is checked in an erase verification step. There is a demand to reduce a processing time of this erase verification step.

DETAILED DESCRIPTION

Embodiments provide a semiconductor memory device which can have a reduced processing time for erase verifications.

In general, according to one embodiment, a semiconductor memory device includes a memory block. The memory block includes a plurality of string units including memory strings comprising memory cell transistors connected in series. A plurality of word lines is provided. Memory cell transistors in a same row of each of the memory strings are connected to the same respective word line in the plurality of word lines. A plurality of bit lines is provided. Each bit line is respectively connected to one of the memory strings in each string unit. The plurality of bits lines is divided into a plurality of bit line groups. A control circuit is configured to perform an erasing operation on of the plurality of memory cell transistors in the memory block. When an erase verification of the erasing operation is performed on a memory cell transistor, the control circuit is configured to execute erase verification on only a subset of memory strings in each string unit of the memory block.

Hereinafter, certain example embodiments of the present disclosure will be described with reference to the drawings.

First Embodiment

In the first embodiment, it is possible to reduce a processing time required for erase verification by reducing the number of charging operations on bit lines or the like required for erase verification on a memory cell transistor belonging to a block by one.

Memory System Configuration

Figure 1:
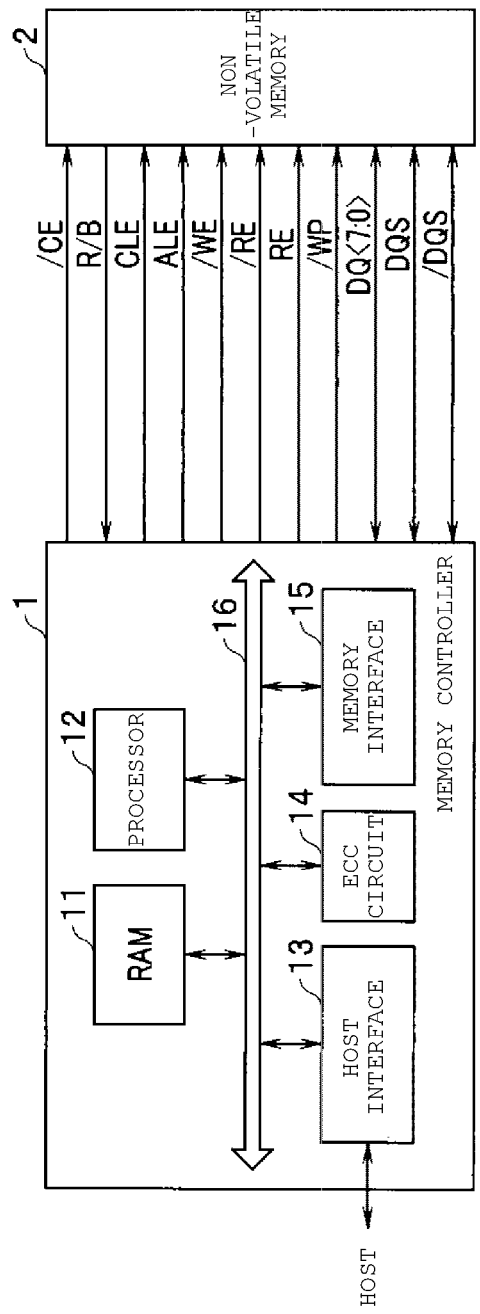
FIG. 1 is a block diagram illustrating a configuration example of a memory system according to an embodiment.

FIG. 1 is a block diagram illustrating a configuration example of a memory system according to an embodiment. The memory system includes a memory controller 1 and a non-volatile memory 2. The memory system can connect to a host. The host is, for example, an electronic apparatus such as a personal computer or a mobile terminal.

The non-volatile memory 2 is a semiconductor memory device which stores data non-volatilely, and includes, for example, a NAND flash memory. In the present disclosure, the non-volatile memory 2 will generally be described as a NAND memory having a memory cell transistor capable of storing 3 bits per memory cell transistor, that is, a NAND memory of 3 bits/Cell (triple-level cell (TLC)), but the present disclosure is not limited thereto. The non-volatile memory 2 is three-dimensional type memory.

The memory controller 1 and the non-volatile memory 2 are connected via a NAND bus. The memory controller 1 controls write of data to the non-volatile memory 2 according to a write request from the host. The memory controller 1 controls read of data from the non-volatile memory 2 according to a read request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other by an internal bus 16.

The host interface 13 outputs a request received from the host, write data which is user data or the like to the internal bus 16. The host interface 13 transmits the user data read from the non-volatile memory 2, the response from the processor 12, and the like to the host.

The memory interface 15 controls a write operation and a read operation of user data or the like to and from the non-volatile memory 2 based on an instruction of the processor 12.

The processor 12 comprehensively controls the memory controller 1. The processor 12 is, for example, a Central Processing Unit (CPU), a micro processing unit (MPU), or the like. In a case of receiving a request from the host via the host interface 13, the processor 12 controls according to the request. For example, the processor 12 instructs the memory interface 15 to write user data and parity information to the non-volatile memory 2 in response to the request from the host. The processor 12 also instructs the memory interface 15 to read the user data and the parity information from the non-volatile memory 2 in response to the request from the host.

The processor 12 determines a storage area (hereinafter, referred to as a memory area) on the non-volatile memory 2 with respect to the user data stored in the RAM 11. The user data is stored in the RAM 11 via the internal bus 16. The processor 12 determines the memory area with respect to data in page unit, which is a write unit, that is, page data. In the present specification, user data stored in one page of the non-volatile memory 2 is referred to as unit data. The unit data is encoded and stored in the non-volatile memory 2 as a code word, for example.

The encoding is not essential. The memory controller 1 may store the unit data in the non-volatile memory 2 without the encoding, and FIG. 1 illustrates a configuration in which the encoding is performed as one configuration example. When the memory controller 1 does not perform the encoding, the page data coincides with the unit data. Furthermore, one code word may be generated based on one unit data, or one code word may be generated based on divided unit data. In addition, one code word may be generated by using a plurality of pieces of unit data.

The processor 12 determines the memory area of the non-volatile memory 2 as a write destination for each unit data. A physical address is assigned to the memory area of the non-volatile memory 2. The processor 12 manages the memory area of the write destination of the unit data by using the physical address. The processor 12 designates the physical address of the determined memory area and instructs the memory interface 15 to write the user data to the non-volatile memory 2. The processor 12 manages a correspondence between a logical address of the user data (a logical address managed by the host) and the physical address. When the processor 12 receives a read request including a logical address from the host, the processor 12 specifies a physical address corresponding to the logical address, designates the physical address, and instructs the memory interface 15 to read user data.

The ECC circuit 14 encodes the user data stored in the RAM 11 to generate a code word. The ECC circuit 14 also decodes the code word read from the non-volatile memory 2.

The RAM 11 temporarily stores the user data received from the host before being stored in the non-volatile memory 2, or temporarily stores the data read from the non-volatile memory 2 before being transmitted to the host. The RAM 11 is a general-purpose memory such as a static random access memory (SRAM) or a dynamic random access memory (DRAM), for example.

FIG. 1 illustrates a configuration example in which the memory controller 1 includes the ECC circuit 14 and the memory interface 15. The ECC circuit 14 may be integrated into the memory interface 15. The ECC circuit 14 may be integrated into the non-volatile memory 2.

When a write request is received from the host, the memory controller 1 operates as follows. The processor 12 temporarily stores write data in the RAM 11. The processor 12 read the data stored in the RAM 11 and inputs the data to the ECC circuit 14. The ECC circuit 14 encodes the input data and applies a code word to the memory interface 15. The memory interface 15 writes the input code word to the non-volatile memory 2.

When a read request is received from the host, the memory controller 1 operates as follows. The memory interface 15 applies the code word read from the non-volatile memory 2 to the ECC circuit 14. The ECC circuit 14 decodes the input code word and stores the decoded data in the RAM 11. The processor 12 transmits the data stored in the RAM 11 to the host via the host interface 13.

Non-Volatile Memory Configuration

Figure 2:
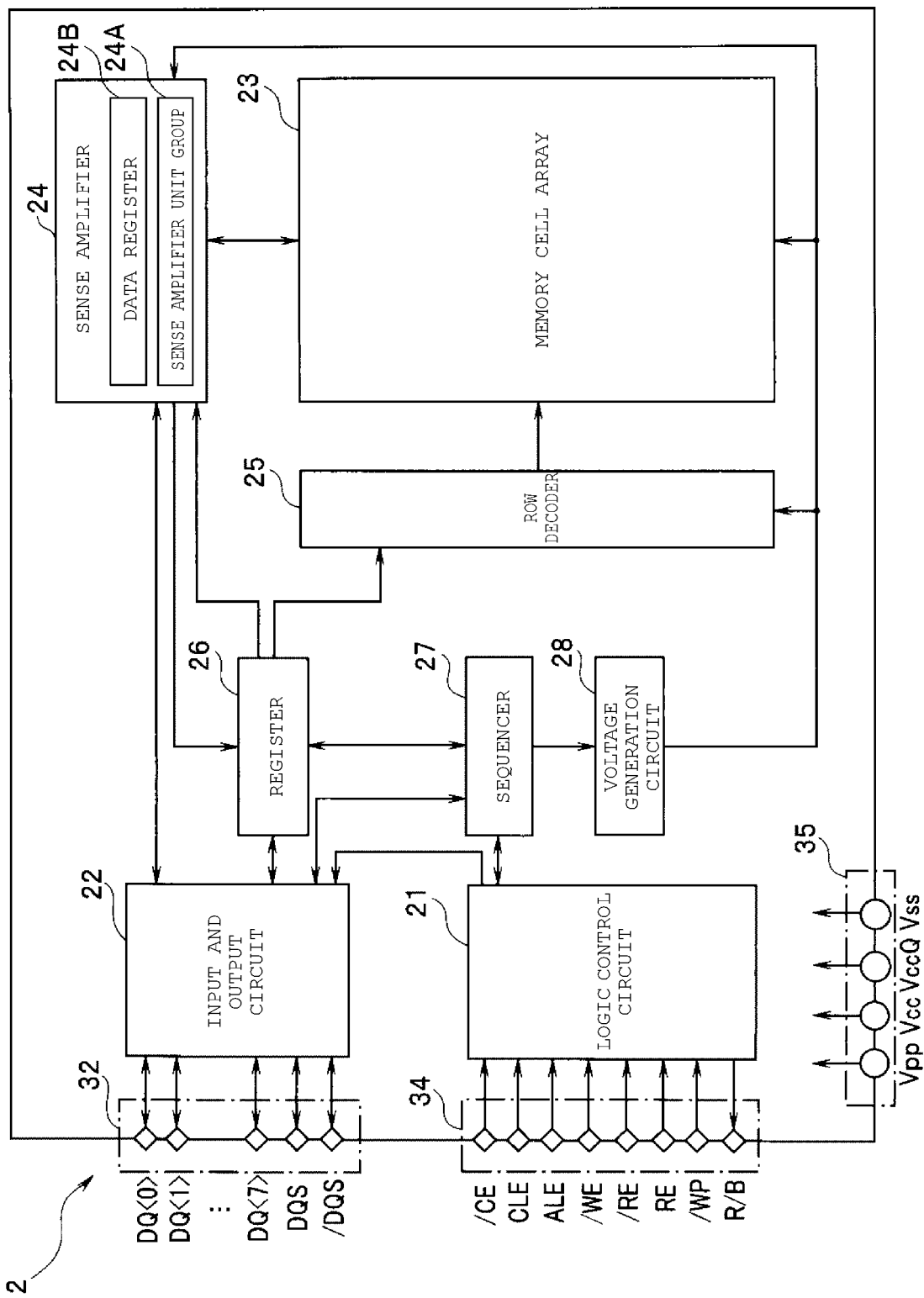
FIG. 2 is a block diagram illustrating a configuration example of a non-volatile memory according to an embodiment.

FIG. 2 is a block diagram illustrating a configuration example of a non-volatile memory according to the present embodiment. The non-volatile memory 2 includes a logic control circuit 21, an input and output circuit 22, a memory cell array 23, a sense amplifier 24, a row decoder 25, a register 26, a sequencer 27, a voltage generation circuit 28, an input and output pad group 32, a logic control pad group 34, and a power input terminal group 35.

The memory cell array 23 includes a plurality of blocks (memory blocks). Each of a plurality of blocks BLK includes a plurality of memory cell transistors (memory cells). A plurality of bit lines, a plurality of word lines, a source line, and the like are disposed in the memory cell array 23 in order to control a voltage to be applied to the memory cell transistor. A specific configuration of the block BLK will be described below.

In order to perform communication of each signal including data with the memory controller 1, the input and output pad group 32 includes a plurality of terminals (pads) corresponding to signals DQ<7:0> and data strobe signals DQS and /DQS.

In order to perform communication of each signal with the memory controller 1, the logic control pad group 34 includes a plurality of terminals (pads) corresponding to a chip enable signal /CE, a command latch enable signal CLE, an address latch enable signal ALE, a write enable signal /WE, read enable signals RE and /RE, and a write protect signal /WP. The "/" added to a signal name indicates active low.

The signal /CE is for selection of the non-volatile memory 2. The signal CLE is for latching a command transmitted as the signal DQ into a command register. The signal ALE is for latching an address transmitted as the signal DQ into an address register. The signal /WE is for write. The signal RE is for read. The signal /WP prohibits write and erasing. A signal R/B indicates whether the non-volatile memory 2 is in a ready state (a state in which an external instruction can be accepted) or a busy state (a state in which an external instruction cannot be accepted). The memory controller 1 can know the state of the non-volatile memory 2 by receiving the signal R/B.

The power input terminal group 35 includes a plurality of terminals for inputting power supply voltages Vcc, VccQ, Vpp, and a ground voltage Vss in order to supply various operating power supplies to the non-volatile memory 2 from the outside. The power supply voltage Vcc is a circuit power supply voltage generally applied from the outside as an operating power supply, and for example, a voltage of approximately 3.3 V is input. As the power supply voltage VccQ, for example, a voltage of 1.2 V is input. The power supply voltage VccQ is used when performing communication of signals between the memory controller 1 and the non-volatile memory 2. The power supply voltage Vpp is a power supply voltage higher than the power supply voltage Vcc, and for example, a voltage of 12 V is input.

The logic control circuit 21 and the input and output circuit 22 are connected to the memory controller 1 via the NAND bus. The input and output circuit 22 performs communication of the signals DQ (for example, DQ0 to DQ7) with the memory controller 1 via the NAND bus.

The logic control circuit 21 receives an external control signal (for example, the chip enable signal /CE, the command latch enable signal CLE, the address latch enable signal ALE, the write enable signal /WE, the read enable signals RE and /RE, and/or the write protect signal /WP) from the memory controller 1 via the NAND bus. The logic control circuit 21 transmits the ready busy signal R/B to the memory controller 1 via the NAND bus.

The register 26 includes a command register, an address register, a status register, and the like. The command register temporarily stores commands. The address register temporarily stores addresses. The status register temporarily stores data necessary for the operation of the non-volatile memory 2. The register 26 is configured with, for example, an SRAM.

The sequencer 27 as a control circuit receives a command from the register 26 and controls the non-volatile memory 2 according to a sequence based on this command.

The voltage generation circuit 28 receives a power supply voltage from the outside of the non-volatile memory 2, and uses this power supply voltage to generate a plurality of voltages required for a write operation, a read operation, and an erasing operation. The voltage generation circuit 28 supplies the generated voltage to the memory cell array 23, the sense amplifier 24, the row decoder 25, and the like.

The row decoder 25 receives a row address from the register 26 and decodes the row address. The row decoder 25 performs a selection operation on a word line based on the decoded row address. The row decoder 25 transfers the plurality of voltages required for the write operation, the read operation, and the erasing operation to the selected block.

The sense amplifier 24 receives a column address from the register 26 and decodes the column address. The sense amplifier 24 selects a bit line based on the decoded column address. The sense amplifier 24 then detects and amplifies data read from the memory cell transistor onto the selected bit line at a time of reading the data. The sense amplifier 24 also transfers write data to the bit line at a time of write of the data.

The sense amplifier 24 has a data register 24B, and the data register 24B temporarily stores the data detected by the sense amplifier 24 at a time of reading the data, and serially transfers the data to the input and output circuit 22. The data register 24B temporarily stores the data serially transferred from the input and output circuit 22 for writing, and transfers the data to the sense amplifier 24. The data register 24B is configured with an SRAM and the like.

Block Configuration of Memory Cell Array

Figure 3:
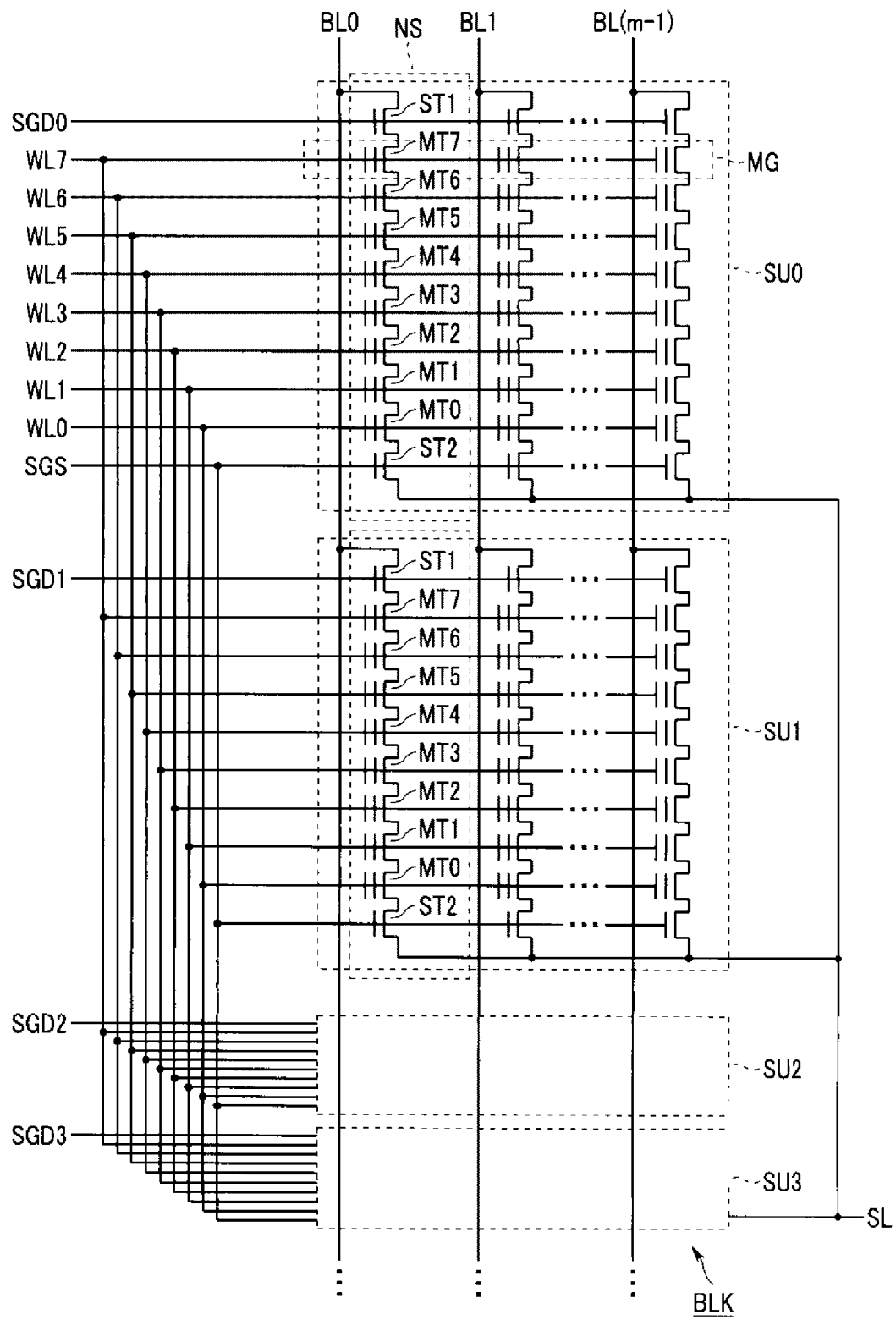
FIG. 3 is a diagram illustrating a configuration example of a block of a NAND memory cell array having a three-dimensional structure.

FIG. 3 is a diagram illustrating a configuration example of a block of the NAND memory cell array 23 having a three-dimensional structure. FIG. 3 illustrates one block BLK among a plurality of blocks constituting the memory cell array 23. Other blocks of the memory cell array also have a configuration identical with FIG. 3. The present embodiment can also be applied to a memory cell array having a two-dimensional structure.

As illustrated, the block BLK includes, for example, four string units (SU0 to SU3). Each string unit includes a plurality of NAND strings NS (also referred to as memory strings). Each of the NAND strings NS includes eight memory cell transistors (MT0 to MT7) (collectively referred to as memory cell transistors MT) and select gate transistors ST1 and ST2. The number of memory cell transistors in the NAND string NS is eight in this example, but is not limited to eight, and may be, for example, 32, 48, 64, 96, or the like. The select gate transistors ST1 and the select gate transistors ST2 are each illustrated as a single transistor in the depicted electric circuit, and may both have a structure identical with the memory cell transistors. In some examples, in order to improve a cutoff characteristic, a plurality of select gate transistors may be used the select gate transistors ST1 and ST2 on each NAND string NS rather than just a single gate transistor ST1 and a single gate transistor ST2. Furthermore, a dummy cell transistor may be provided between the memory cell transistors and one or both of the select gate transistors ST1 and ST2.

The memory cell transistors MT0-MT7 are connected in series between the select gate transistors ST1 and ST2. The memory cell transistor MT7 on one end side is connected to the select gate transistor ST1, and the memory cell transistor MT0 on the other end side is connected to the select gate transistor ST2.

Gates of the select gate transistors ST1 of the string units SU0 to SU3 are respectively connected to select gate lines SGD0 to SGD3. Gates of the select gate transistors ST2 are commonly connected to the same select gate line SGS among a plurality of string units SU in the same block BLK. Gates of the memory cell transistors MT0 to MT7 in the same block BLK are connected to word lines WL0 to WL7, respectively. That is, the word lines WL0 to WL7 and the select gate line SGS are connected in common between the plurality of string units SU0 to SU3 in the same block BLK. On the other hand, the select gate line SGD is independent for each string unit SU0 to SU3 even in the same block BLK.

The word lines WL0 to WL7 are respectively connected to the gates of the memory cell transistors MT0 to MT7 constituting the NAND strings NS. That is, gates of the memory cell transistors MTi in the same row in the block BLK are connected to the same word line WLi. In the following description, the NAND string NS may be simply referred to as a "string".

Each NAND string NS is connected to a corresponding bit line. Therefore, each memory cell transistor MT is connected to a bit line via the select gate transistor ST in the NAND string NS or another memory cell transistor MT. As described above, data of the memory cell transistors MT in the same block BLK is collectively erased. On the other hand, read and write of data is performed in memory cell group MG units (or page units). In the present specification, a plurality of memory cell transistors MT connected to one word line WLi and belonging to the same string unit SU are referred to as a memory cell group MG. In the present embodiment, the non-volatile memory 2 is a TLC NAND memory capable of storing 3-bit data (8 values). Therefore, each memory cell group MG can store data for three different pages. The 3 bits which can be stored by each memory cell transistor MT correspond to these three different pages.

Figure 4:
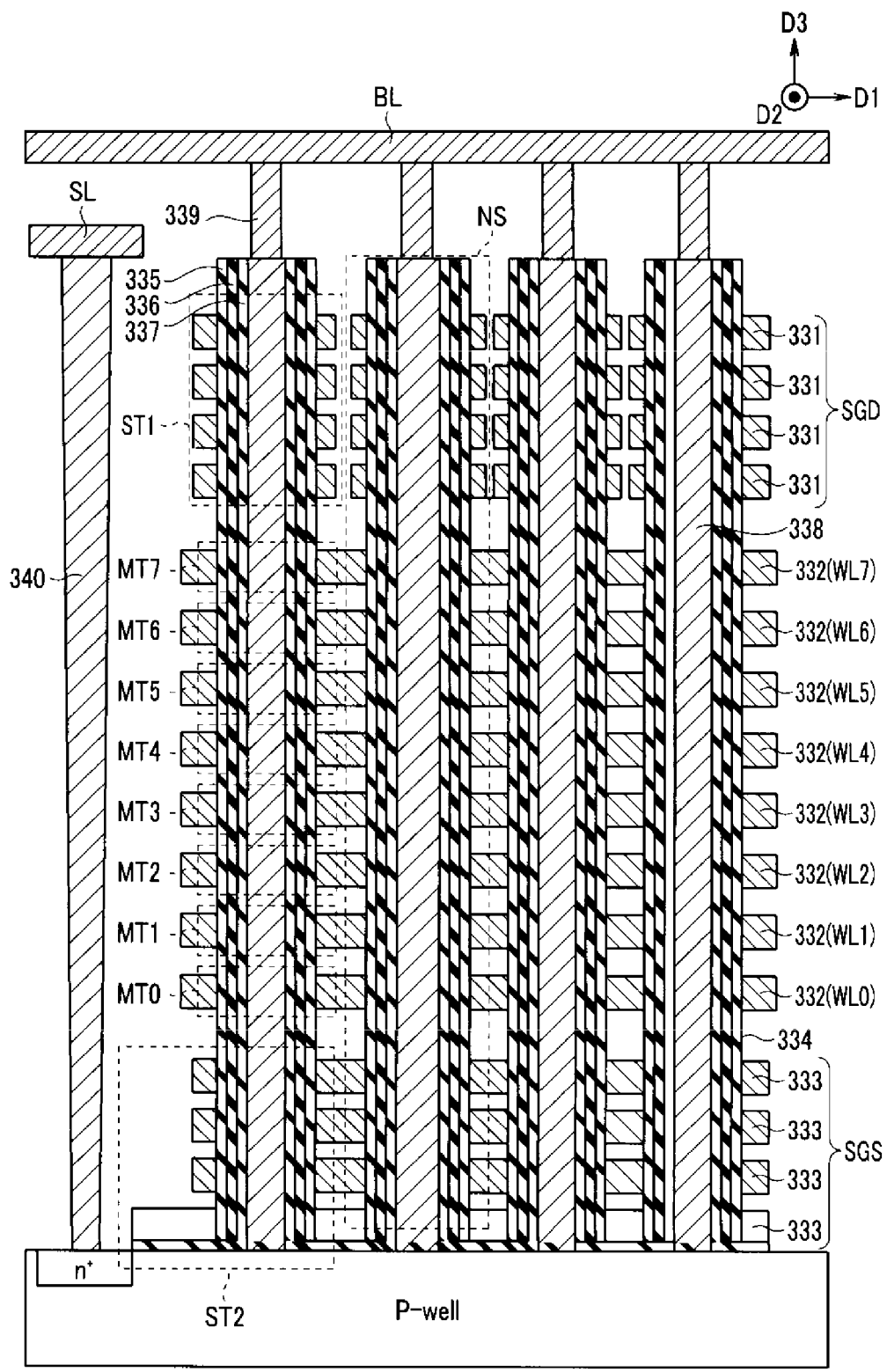
FIG. 4 is a cross-sectional view of a partial area of a NAND memory cell array.

FIG. 4 is a cross-sectional view of a partial area of a NAND memory cell array having a three-dimensional structure. As illustrated in FIG. 4, the plurality of NAND strings NS are arranged in a D1 direction on a p-type well area (a P-well). That is, on the p-type well area, a plurality of wiring layers 333 functioning as the select gate lines SGS, a plurality of wiring layers 332 functioning as the word lines WLi, and a plurality of wiring layers 331 functioning as the select gate lines SGD are stacked.

A memory hole 334 which penetrates these wiring layers 333, 332, and 331 and reaches the p-type well area is formed. A block insulating film 335, a charge storage film 336 (a charge storing area), and a gate insulating film 337 are subsequently formed on a side surface of the memory hole 334, and a conductor column 338 is embedded in the memory hole 334. The conductor column 338 is made of polysilicon, for example, and functions as an area in which channels are formed at a time of operations of the memory cell transistors MT and the select gate transistors ST1 and ST2 in the NAND string NS. That is, the wiring layer 331, the conductor column 338, and the films 335 to 337 between the wiring layer 331 and the conductor column 338 each function as the select gate transistor ST1, and the wiring layer 332, the conductor column 338, and the films 335 to 337 between the wiring layer 332 and the conductor column 338 each function as the memory cell transistor MT, and the wiring layer 333, each conductor column 338, and the films 335 to 337 between the wiring layer 333 and each conductor column 338 function as the select gate transistor ST2.

In FIG. 4, the memory hole 334 and the conductor column 338 have cylindrical shapes having identical diameters, but, in general, actual devices usually have tapered shapes with smaller diameters toward the p-type well area. Furthermore, depending on a manufacturing process, the memory hole 334 and the conductor column 338 may comprise a plurality of different stages with each stage having its own tapered shape in which the diameter is increased in the middle of the tapered shape and the diameter is reduced again toward the p-type well area.

In each NAND string NS, the select gate transistor ST2, the plurality of memory cell transistors MT, and the select gate transistor ST1 are sequentially formed on the p-type well area. A wiring layer which functions as a bit line BL is formed on an upper side (in the D3 direction) of the conductor column 338. A contact plug 339 which connects the conductor column 338 and the bit line BL is formed at an upper end of the conductor column 338.

An n+ type impurity diffusion layer and a p+ type impurity diffusion layer are formed on a surface of the p-type well area. A contact plug 340 is formed on the n+ type impurity diffusion layer, and a wiring layer which functions as a source line SL is formed on the contact plug 340.

A plurality of configurations illustrated in FIG. 4 are arranged in a page depth direction (in a D2 direction into and out of the page) in FIG. 4, and one string unit SU is formed by a group of NAND strings NS arranged in a row along the depth direction (the D2 direction in FIG. 4).

String Configuration

Figure 5:
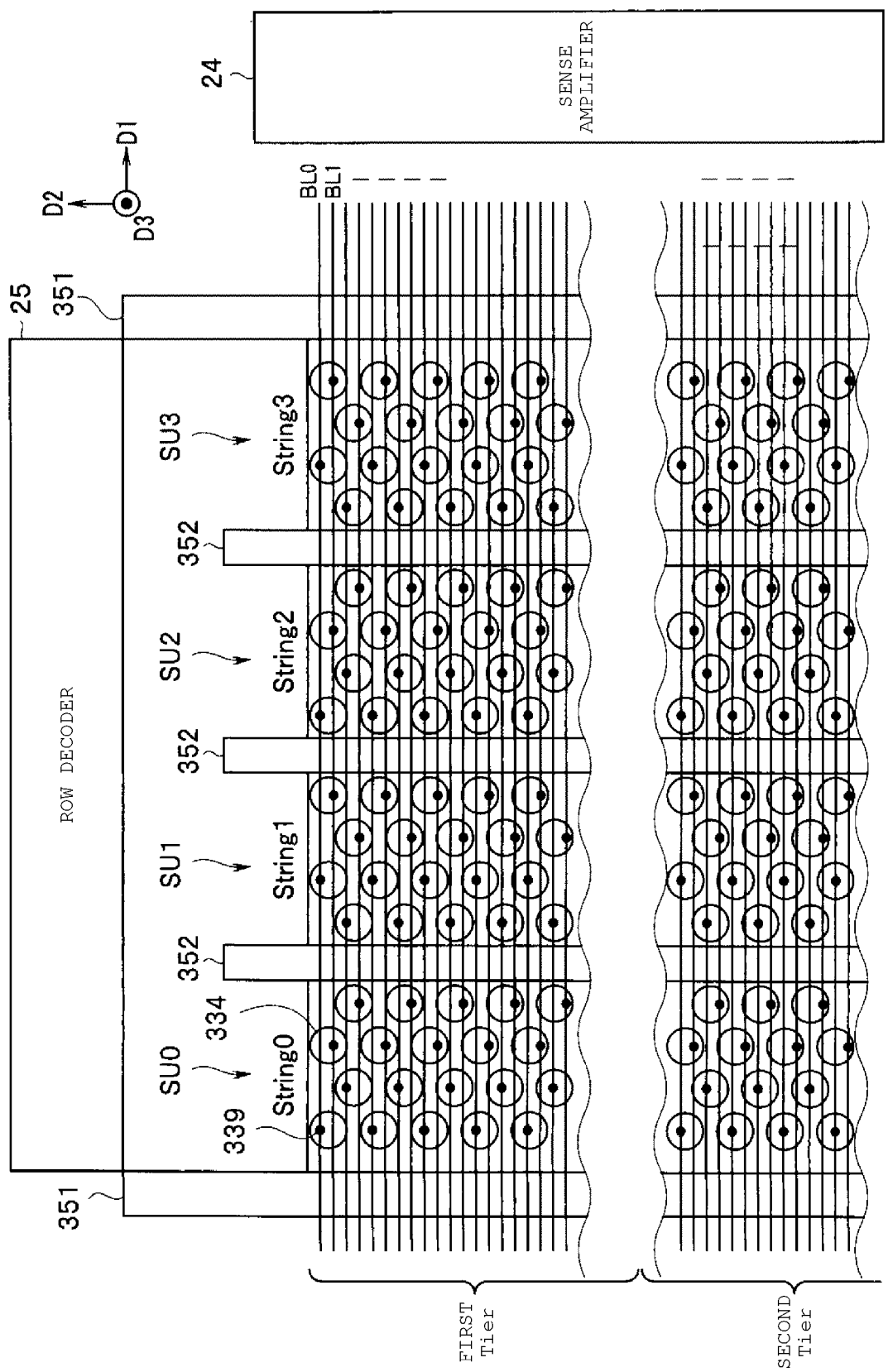
FIG. 5 is an explanatory view illustrating arrangement of each NAND string in a block.

FIG. 5 is an explanatory view illustrating arrangement of each NAND string in one block BLK. The circles in FIG. 5 indicate the memory holes 334 constituting the NAND strings. An insulating layer 351 separates the one block BLK illustrated in FIG. 5 from other blocks BLK. The example in FIG. 5 illustrates an example in which the four string units SU0 to SU3 each separated by an insulating layer 352 are in one block BLK. The insulating layer 352 extends to the wiring layer 331 constituting the select gate line SGD and separates the string units SU0 to SU3 from each other.

In FIG. 5, every NAND string in the string unit SU0 is referred to as a string String0, every NAND string in the string unit SU1 is referred to as a string String1, every NAND string in the string unit SU2 is referred to as a string String2, and every NAND string in the string unit SU3 is referred to as a string String3.

A plurality of memory holes 334 constituting the NAND strings are provided in each string unit, and each memory hole 334 in a string unit is connected to each of the bit lines BL0, BL1, etc. by a contact plug 339. Each of the bit lines BL0, BL1, etc. is connected to each of the four strings String0 to String3.

Each string unit has m NAND strings respectively corresponding to the bit lines BL0 to BL (m−1). In the present embodiment, the bit lines BL0 to BL (m−1) are divided into a plurality of groups, and a set of NAND strings corresponding to each group of bit lines BL or a set including one of the groups of the bit lines BL can be referred to as a "Tier," in some cases. For example, when m bit lines BL are divided into four groups, each of the NAND strings in the same string unit corresponding to set group of bit lines BL is referred to as being in one of the first to fourth Tiers. In the present embodiment, the bit lines BL in the same Tier may or may not be adjacent to each other in numbering or physical position, but the Tier may still be referred to as a unit. The number of bit lines BL in each Tier may or may not be identical with each other, but the same bit line BL cannot be in two different Tiers.

Sense Amplifier

Figure 6:
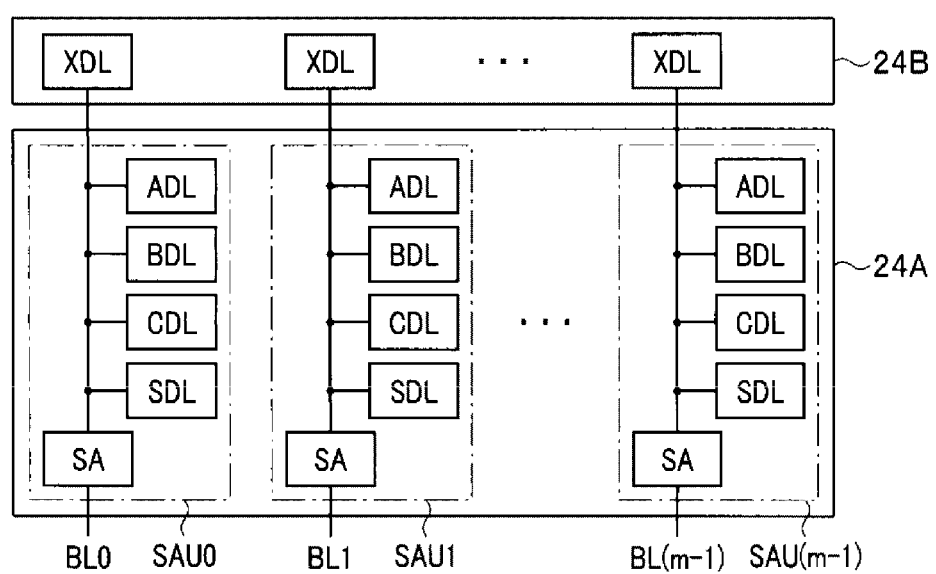
FIG. 6 is a block diagram illustrating an example of a configuration of a sense amplifier.

FIG. 6 is a block diagram illustrating an example of the sense amplifier 24 in FIG. 2.

The sense amplifier 24 includes a sense amplifier unit group 24A and a data register 24B. The sense amplifier unit group 24A includes sense amplifier units SAU0 to SAU (m−1) corresponding to the bit lines BL0 to BL (m−1). Each sense amplifier unit SAU includes a sense amplifier unit SA and data latch circuits SDL, ADL, BDL, and CDL. The sense amplifier unit SA and the data latch circuits SDL, ADL, BDL, and CDL are connected so that data can be transferred to each other.

The data latch circuits SDL, ADL, BDL, and CDL temporarily store data. At a time of a write operation, the sense amplifier unit SA controls a voltage of the bit line BL according to the data stored by the data latch circuit SDL. The data latch circuits ADL, BDL, and CDL are used for a multi-value operation in which the memory cell transistor MT stores data equal to or more than 2 bits. That is, the data latch circuit ADL is used to store a lower page. The data latch circuit BDL is used to store a middle page. The data latch circuit CDL is used to store a top page. The number of data latch circuits in the sense amplifier unit SAU can be changed into any number according to the number of bits stored by one memory cell transistor MT.

At a time of a read operation, the sense amplifier unit SA detects data read on the corresponding bit line BL and determines whether the data is data of "0" or data of "1". Further, the sense amplifier unit SA applies a voltage to the bit line BL based on the write data at the time of the write operation.

The data register 24B includes the number of data latch circuits XDL corresponding to the sense amplifier units SAU0 to SAU (m−1). The data latch circuit XDL is connected to the input and output circuit 21. The data latch circuit XDL is a circuit used for data transfer between the sense amplifier 24 and the outside, temporarily stores the write data transmitted from the input and output circuit 21, and temporarily stores the read data from the sense amplifier unit SAU. More specifically, data transfer between the input and output circuit 21 and the sense amplifier units SAU0 to SAU (m−1) is performed via the data latch circuit XDL for one page. The write data received by the input and output circuit 21 is transferred to any one of the data latch circuits ADL, BDL, and CDL via the data latch circuit XDL. The read data read by the sense amplifier unit SA is transferred to the input and output circuit 21 via the data latch circuit XDL.

Row Decoder

Figure 7:
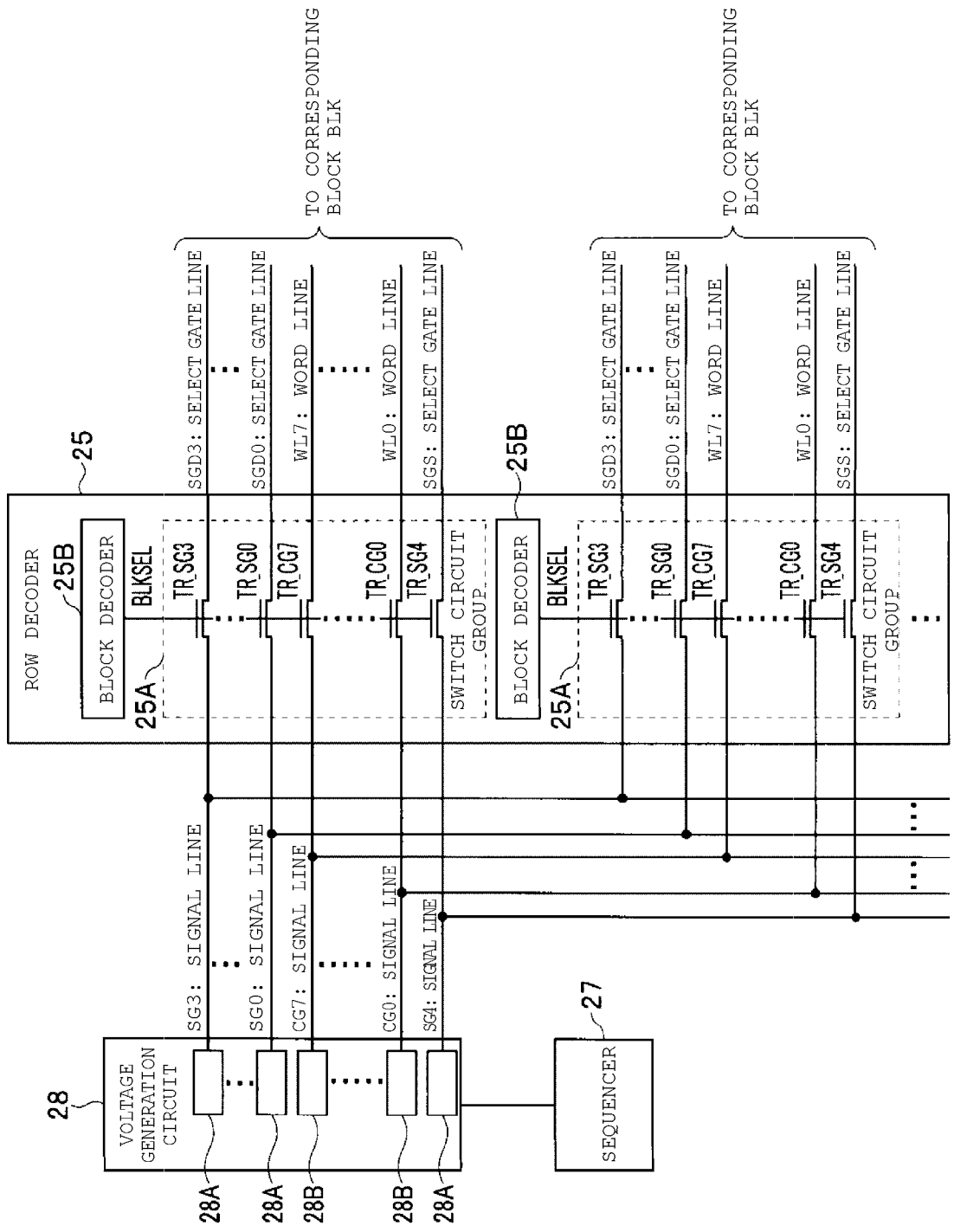
FIG. 7 is a block diagram illustrating an example of a configuration of a row decoder.

FIG. 7 is a block diagram illustrating an example of a configuration of the row decoder 25 in FIG. 2.

The voltage generation circuit 28 includes a plurality of SG drivers (select gate line drivers) 28A which respectively supply voltages to signal lines SG0 to SG4, and a plurality of CG drivers (word line drivers) 28B which respectively supply voltages to signal lines CG0 to CG7. These signal lines SG0 to SG4 and CG0 to CG7 are branched by the row decoder 25 and connected to wiring of each block BLK. That is, the signal lines SG0 to SG3 function as global drain side select gate lines, and are connected to the select gate lines SGD0 to SGD3 as the local select gate lines in each block BLK via the row decoder 25. The signal lines CG0 to CG7 function as global word lines and are connected to the word lines WL0 to WL7 as local word lines in each block BLK via the row decoder 25. The signal line SG4 functions as a global source side select gate line, and is connected to the select gate line SGS as a local select gate line in each block BLK via the row decoder 25.

The voltage generation circuit 28 is controlled by the sequencer 27 to generate various voltages. The SG driver 28A and the CG driver 28B respectively supply various generated voltages to the corresponding signal lines SG0 to SG4 and signal lines CG0 to CG7. For example, according to an operation target (a row address) in the read operation, each CG driver 28B selects a voltage such as a voltage VCGRV, a voltage VREAD, or an erase verification voltage VCG_ER and supplies the voltage to the corresponding word line WL.

The row decoder 25 has a plurality of switch circuit groups 25A corresponding to each block, and a plurality of block decoders 25B provided corresponding to the plurality of switch circuit groups 25A. Each switch circuit group 25A has a plurality of transistors TR_SG0 to TR_SG3 respectively connecting the signal lines SG0 to SG3 and the select gate lines SGD0 to SGD3, and a plurality of transistors TR_CG0 to TR_CG7 respectively connecting the signal lines CG0 to CG7 and the word lines WL0 to WL7, and a transistor TR_SG4 connecting the signal line SG4 and the select gate line SGS. Each of the transistors TR_SG0 to TR_SG4 and the transistors TR_CG0 to TR_CG7 is a high breakdown voltage transistor.

Each block decoder 25B supplies a block selection signal BLKSEL to gates of the transistors TR_SG0 to TR_SG4 and the transistors TR_CG0 to TR_CG7 when the block decoder 25B is designated by the row address. As a result, in the switch circuit group 25A to which the block selection signal BLKSEL is supplied from the block decoder 25B designated by the row address, the transistors TR_SG0 to TR_SG4 and the transistors TR_CG0 to TR_CG7 are turned on and conduct, so that voltages supplied from the voltage generation circuit 28 to the signal lines SG0 to SG4 and the signal lines CG0 to CG7 are supplied to the select gate lines SGD0 to SGD3 and SGS, and the word lines WL0 to WL7 in the block BLK to be operated.

That is, various voltages necessary for the operation are supplied to each word line WL by the voltage generation circuit 28 and the row decoder 25. For example, a voltage VSGD is supplied to the select gate line SGD (SGDsel) connected to the select gate transistor ST1 belonging to the string unit SU to be operated, the voltage Vss is supplied to the select gate line SGD (SGDusel) connected to the select gate transistor ST1 not belonging to the string unit SU to be operated, and a voltage VSGS is supplied to the select gate select gate line SGS collectively connected to the select gate transistor ST2 in each block BLK.

Threshold Voltage Distribution

When writing multi-value data to the memory cell transistor MT, a threshold voltage of the memory cell transistor MT is set to a value in accordance with a value of the data. When a program voltage VPGM and a bit line voltage VBL are applied to the memory cell transistor MT, electrons are injected into the charge storage film 336 and the threshold voltage rises. By increasing the program voltage VPGM, the amount of injected electrons can be increased, and the threshold voltage of the memory cell transistor MT can be increased. Meanwhile, even when the identical program voltage VPGM is applied due to variations in the memory cell transistors MT, the amount of injected electrons differs for each memory cell transistor MT. The electrons injected once are stored until an erasing operation is performed. Therefore, a program operation and a verification operation (a loop) are performed a plurality of times while increasing the program voltage VPGM so as not to exceed an allowable threshold voltage range (hereinafter, referred to as a target area) as a threshold voltage to be set in each memory cell transistor MT.

After the program operation, by reading the data, a verification operation of determining whether or not the threshold voltage of the memory cell transistor reaches the target area is performed. By repeating a combination of the program operation and the verification operation, the threshold voltage of the memory cell transistor is increased up to the target area. The memory cell transistor determined by the verification operation that the threshold voltage reaches the target area, that is, exceeds the target level, which is the lowest value in the target area, is subsequently write protected.

Figure 8:
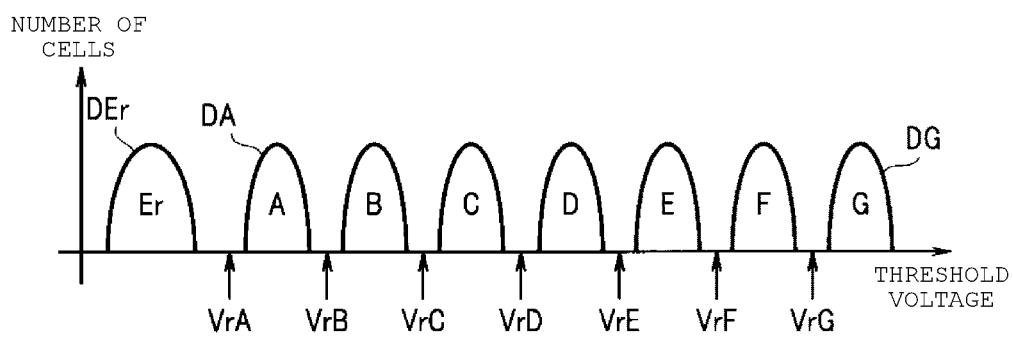
FIG. 8 is a diagram illustrating a threshold voltage distribution for a memory cell array.

FIG. 8 is a diagram illustrating a threshold voltage distribution of a memory cell array, with a threshold voltage on a horizontal axis and the number of memory cell transistors (the number of cells) on a vertical axis. FIG. 8 illustrates an example of a threshold voltage distribution of the non-volatile memory 2 of 3 bits/Cell. In the non-volatile memory 2, the threshold voltage of the memory cell transistor MT is set according to each data value of the multi-value data stored in the memory cell transistor MT. Since injection of the amount of charge into the charge storage film (the charge storing area) is probabilistic, the threshold voltage of each memory cell transistor MT is also statistically distributed as illustrated in FIG. 8.

FIG. 8 illustrates the threshold voltage distribution in eight peak areas of DEr, DA, DB, DC, DD, DE, DF, and DG, and a width of the threshold voltage in each of these areas corresponds to each target area. In the example in FIG. 8, by setting the threshold voltage of the memory cell transistor MT in any one of the eight target areas, it is possible to store data of eight values (3-bit data) in the memory cell transistor MT.

In FIG. 8, a target area in which a threshold voltage Vth is equal to or lower than a voltage VrA is called an Er state, a target area in which the threshold voltage is larger than the voltage VrA and equal to or lower than a voltage VrB is called an A state, a target area in which the threshold voltage is larger than the voltage VrB and equal to or lower than a voltage VrC is called a B state, and a target area in which the threshold voltage is larger than the voltage VrC and equal to or lower than a voltage VrD is called a C state. In the same manner, as illustrated in FIG. 8, a D state to a G state are set according to respective voltages.

That is, the state indicates which target area corresponds to a data value stored in each memory cell transistor MT, and when 3 bits (8 values), the target area is divided into eight states of the Er and A to G states. The threshold voltage distributions respectively corresponding to the Er, A, B, C, D, E, F, and G states are respectively called distributions DEr, DA, DB, DC, DE, DF, and DG. The voltages VrA to VrG are reference voltages which serve as boundaries between the respective target areas. In the verification operation, the voltages VrA to VrG may be applied to the word line WL as verification levels (voltages) and a read is performed, and it may be determined that the threshold voltage corresponding to the state is reached as the target memory cell transistor MT is turned off.

Read Operation

In order to read data from the multi-valued memory cell transistor, the row decoder 25 applies a read voltage to the word line (hereinafter, referred to as a selected word line) WL to which the memory cell transistor MT to be read is connected, the sense amplifier 24 senses data read by the bit line BL, and it is determined whether the read data is "0" or "1". In order to conduct the memory cell transistor connected to the word line (hereinafter, referred to as a non-selected word line) WL other than the selected word line, the row decoder 25 applies the sufficiently high voltage VREAD necessary to turn on each memory cell transistor, to the non-selected word line WL.

At the time of read operation, the sense amplifier 24 fixes the bit line BL to a constant voltage (for example, 0.5 V), and charges a sense node inside the sense amplifier unit SA to a predetermined pre-charge voltage Vpre higher than a voltage of the bit line BL. In this state, the sense amplifier 24 electrically connects the sense node to the bit line BL. Thus, a current flows from the sense node to the bit line BL, and a voltage of the sense node gradually decreases.

The voltage of the sense node changes according to a state of the threshold voltage of the memory cell transistor connected to the corresponding bit line BL. That is, when the threshold voltage of the memory cell transistor is lower than the read voltage, the memory cell transistor is in an on state, a large cell current flows through the memory cell transistor, and the voltage of the sense node drops at a high speed. In addition, when the threshold voltage of the memory cell transistor is higher than the read voltage, the memory cell transistor is in an off state, and the cell current flowing through the memory cell transistor is small, or the cell current does not flow through the memory cell transistor, and the voltage of the sense node drops at a low speed.

By using a difference in voltage drop speeds of the sense node, a write state of the memory cell transistor is determined, and the result is stored in the data latch circuit. For example, at a first time point when a predetermined first period elapses from a start of discharging the electric charge of the sense node, it is determined whether the voltage of the sense node is a low level ("L") or a high level ("H"). For example, when the threshold voltage of the memory cell transistor is lower than the read voltage, the memory cell transistor is completely in the on state, and a large cell current flows through the memory cell transistor. Therefore, the voltage of the sense node drops rapidly, the amount of voltage drop is relatively large, and the sense node becomes "L" at the first time point.

When the threshold voltage of the memory cell transistor is higher than the read voltage, the memory cell transistor is in the off state, and the cell current flowing through the memory cell transistor is very small, or the cell current does not flow through the memory cell transistor. Therefore, the voltage of the sense node drops very slowly, the amount of voltage drop is relatively small, and the sense node remains in the "H" at the first time point.

In this manner, the sense amplifier 24 monitors the state of the sense node while applying the read voltage to the selected word line by the row decoder 25, it is determined whether the threshold voltage of the memory cell transistor is higher or lower than the read voltage. Therefore, by applying the voltage between the states to the selected word line WL as the read voltage, the state of each memory cell transistor can be determined and the data assigned to each state can be read.

Issue of Erase Verification

Figure 9:
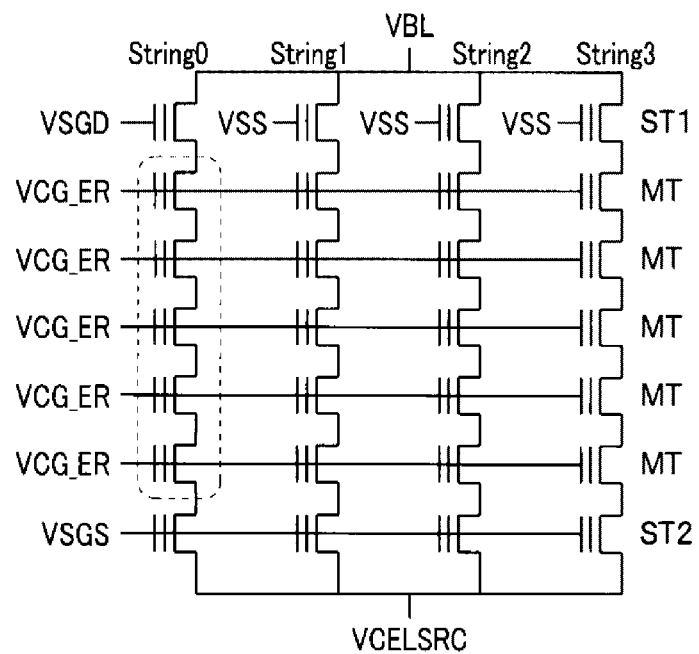
FIG. 9 is a diagram illustrating aspects of an operation at a time of erase verification.
Figure 10:
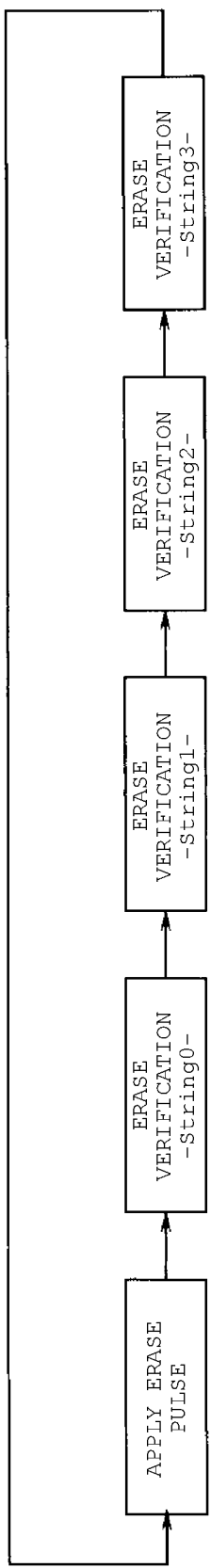
FIG. 10 is an explanatory view for illustrating aspects of a problem at a time of an erase verification in related art.

FIG. 9 is a circuit diagram illustrating an operation at a time of erase verification, and FIG. 10 is an explanatory view illustrating a problem at the time of erase verification. FIG. 9 illustrates strings String0 to String3 (see FIG. 5) that are each connected to the same bit line BL in a block. As was described in FIG. 3, the strings String0 to String3 (which are NAND strings in different string units) each include a select gate transistor ST1, memory cell transistors MT, and a select gate transistor ST2 in series. Drains of the select gate transistors ST1 of the strings String0 to String3 are all connected to the bit line BL, and the predetermined bit line voltage VBL is applied. The sources of the select gate transistors ST2 of the strings String0 to String3 are all connected to the source line SL.

FIG. 10 illustrates an erase sequence in the related art. As illustrated in FIG. 10, at a time of erasing, a predetermined high-voltage pulse (hereinafter, referred to as an erase pulse) is applied to the source line SL. As a result, a charge accumulated in the charge storage film 336 of each memory cell transistor MT of the strings String0 to String3 is discharged, and the threshold voltage of all the memory cell transistors MT is returned to the Er state (an erase state).

Erase verification is then performed to check whether or not the memory cell transistors MT reach the Er state. The erase verification is performed by applying an erase verification voltage VCG_ER, which is higher than the Er state, to a gate of each memory cell transistor MT. For example, the erase verification voltage VCG_ER corresponds in level to the voltage VrA in FIG. 8. The voltage VSGS for turning on the select gate transistor ST2 is applied to the gate of the select gate transistor ST2. The voltage VSGD for turning on the select gate transistors ST1 of the NAND strings to be verified is applied to the gate of only those select gate transistor ST1 of the NAND strings to be verified, and the voltage VSS is applied to the gate of the select gate transistors ST1 to be turned off of the other NAND strings. That is, the example in FIG. 9 illustrates that a string String0 is first verified according to the sequence in FIG. 10.

In this case of FIG. 10, in each block BLK, the erase verification is performed for all the strings String0 of the string unit SU0, however, in the following description for simplification, only one string String0 connected to one bit line BL will be described. In the same manner, for the other string units SU1 to SU3, only the strings String1 to String3 connected to the same one bit line BL will be described.

The sense amplifier 24 fixes the bit line BL to a constant voltage (for example, 0.5 V), and charges the sense node inside the sense amplifier unit SA to the predetermined pre-charge voltage Vpre higher than the voltage of the bit line BL. In this state, the sense amplifier 24 connects the sense node to the bit line BL. Thus, a current flows from the sense node to the bit line BL, and a voltage of the sense node gradually decreases.

When the threshold voltage of all the memory cell transistors MT of the string String0 are in the Er state, if the erase verification voltage VCG_ER is applied to the gate of the memory cell transistors MT, all the memory cell transistors MT will be in the on state and a large cell current flows through the memory cell transistors MT, and the voltage of the sense node drops at a high speed.

On the other hand, if the threshold voltage of any one of the memory cell transistors MT of the string String0 is not returned to the Er state, the memory cell transistor MT will be in the off state, the current flowing through the memory cell transistor MT, that is, the current flowing through the bit line BL is smaller, or no current flows, and the voltage of the sense node drops at a lower speed.

Therefore, when the voltage drop speed of the sense node is fast, it can be determined that the erasing of the string String0 was successful, and when the voltage drop speed of the sense node is slow, it can be determined that the erasing fails since a memory cell transistor MT exists in the string String0 that has not been returned to the Er state.

Next, according to the sequence in FIG. 10, the identical process is repeated with the string String1 as a verification target. Then erase verification is similarly performed on the string String2 and the string String3. That is, in the sequence in FIG. 10, in the erase sequence of one block BLK, it is necessary to separately repeat the erase verification for the strings String0 to String3 after the application of the erase pulse, and thus there is a drawback that the erase verification takes a relatively long time.

Erase Verification in Tier Units

In the present embodiment, a processing time of the erase verification can be reduced by reducing the number of charging operations on the bit lines and the like required for the erase verification and also by reducing a detection time by the sense amplifier 24. Even for the memory cell transistors MT in the same BLK, erase characteristics may differ for each string unit SU due to variations or the like in the manufacturing process. On the other hand, within the same string unit SU, memory cell transistors will generally have approximately identical erase characteristics for NAND strings. In the present embodiment, by using this characteristic of near identical erase characteristics, some NAND strings can be selected from the string units SU0 to SU3, and the erase verification is performed on these representative NAND strings as a verification target.

Figure 11:
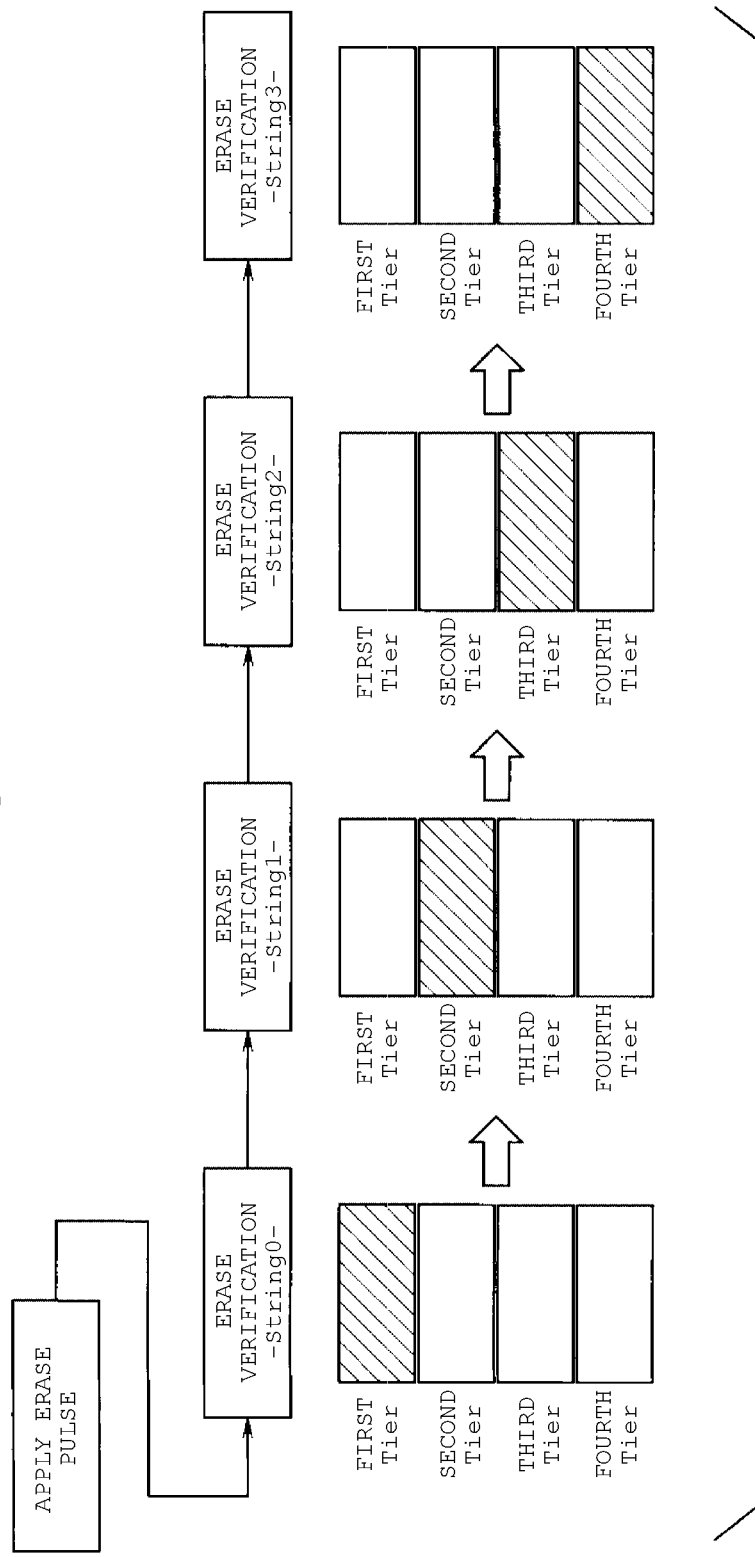
FIG. 11 is an explanatory view illustrating aspects of an erase verification according to an embodiment.

FIG. 11 is an explanatory view illustrating erase verification according to the present embodiment. FIG. 11 illustrates an example in which each string unit is divided into four Tiers (first Tier to fourth Tier). Each string unit SU0 to SU3 in FIG. 5 is divided into tiers and one box represents one Tier of a string unit in FIG. 11. In the following description, a bit line BL connected to a NAND string belonging to a particular Tier may be referred to as the bit line BL belonging to the Tier.

Figure 12:
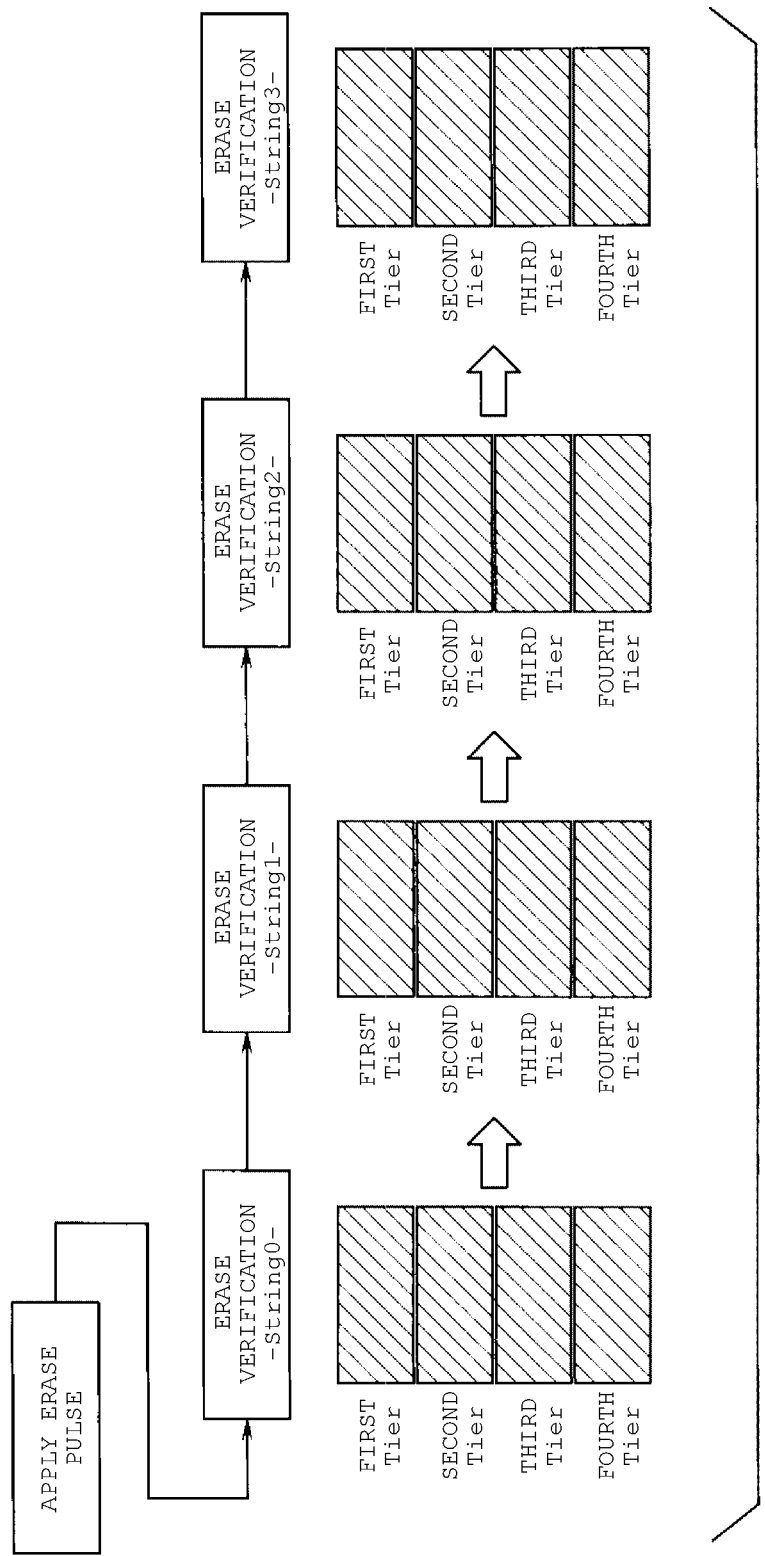
FIG. 12 is a diagram illustrating an erase sequence in related art.

The diagonal hatch lines in FIG. 11 indicate the Tiers to be verified for each string unit. FIG. 12 similarly illustrates an erase sequence in the related art (as illustrated in FIG. 10). In FIG. 12, every NAND string unit in every string unit is a verification target.

However, in the present embodiment, not all NAND strings are verification targets, but rather only some NAND strings in each string unit are the verification targets, as is the case illustrated in FIG. 11. In the present embodiment, in the erase verification of the strings String0 to String3, the particular Tier to be verified is selected so that the verification for the same Tier in different string units is not performed more than once.

In the erase verification of the related art, the strings String0 to String3, which are commonly connected to the same bit lines BL, are verified in order. That is, all NAND strings are verified for each string unit SU. In the example in FIG. 12, verification is performed with respect to all Tiers of each string unit SU in the order of string units SU0, SU1, SU2, and SU3, that is, for each bit line BL, in order of strings String0 to String3. For those NAND strings with successful verification, the voltage drop speed of the sense node connected to the corresponding bit line BL becomes faster. In order to obtain the voltage drop speed of the sense node, the sense amplifier 24 needs to set the bit lines BL to a fixed voltage at a time of a start of verification and charge the voltage of the sense node to a predetermined voltage. That is, the sense amplifier 24 needs to charge the bit lines BL and the sense node at a time of the start of verification of each string String0 to String3, and it takes a relatively long time for this charging.

On the other hand, in the present embodiment, in the verification of each string String0 to String3, only one of the four strings String0 to String3 connected to the same bit line BL will be a verification target. In the example in FIG. 11, for verifying the string unit SU0, only a String0 in the first Tier is the verification target, for verifying the string unit SU1, only a String1 in the second Tier is the verification target, for verifying the string unit SU2, only a String2 in the third Tier is the verification target, and for verifying the string unit SU3, only a String3 in the fourth Tier is the verification target. That is, in the present example, only first tier NAND strings of string unit SU0 are verified, only second tier NAND strings of string unit SU1 are verified, only third tier NAND strings of string unit SU2 are verified, and only fourth tier NAND strings of string unit SU3 are verified.

If all the bit lines BL and the sense node are charged at a start of verification of the first string String0, it is not necessary to charge the bit lines BL and the sense node again at the start of the verification for the subsequent strings String1 to String3. Therefore, in the present embodiment, the erase processing time can be reduced by the amount of this charging period that is avoided.

The sense amplifier 24 may initialize various data latch circuits at the time of verification. Hereinafter, the process such as charging of the bit line BL and the sense node and initialization of the data latch circuit necessary for verification will be referred to as a verification preparation process by the sense amplifier 24. After performing the verification preparation process, the sense amplifier 24 electrically connects the sense node to the bit line BL under control of the sequencer 27. In the present embodiment, when erase verification is performed on the block BLK, the verification preparation process is performed only at a time of a start of verification on the first string String0, and the verification preparation process at a time of a start of the verification on the subsequent string String1 to String3 is omitted, so that a time required for the erase verification is reduced.

Figure 13:
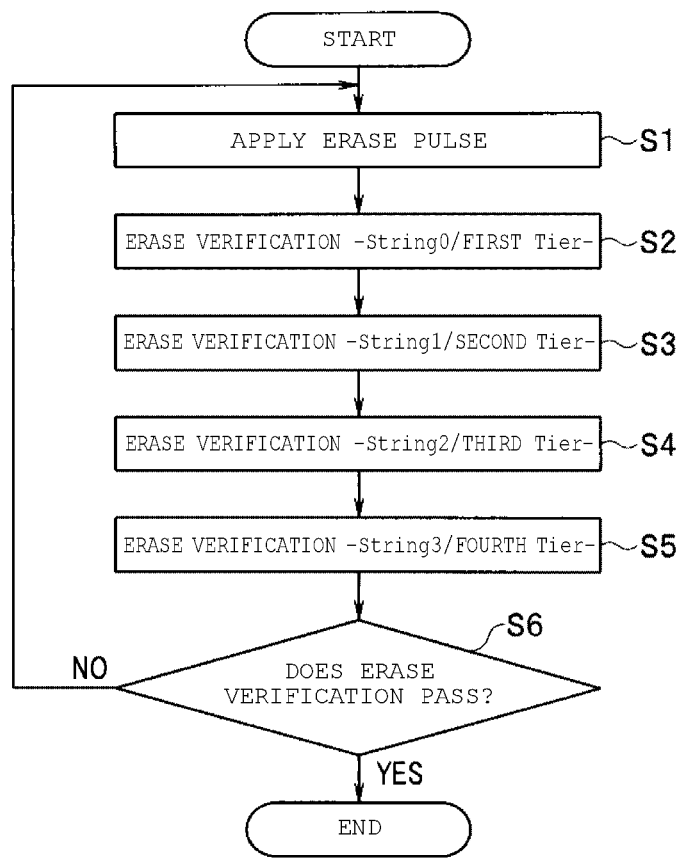
FIG. 13 is a flowchart of an erase verification operation according to an embodiment.
Figure 14:
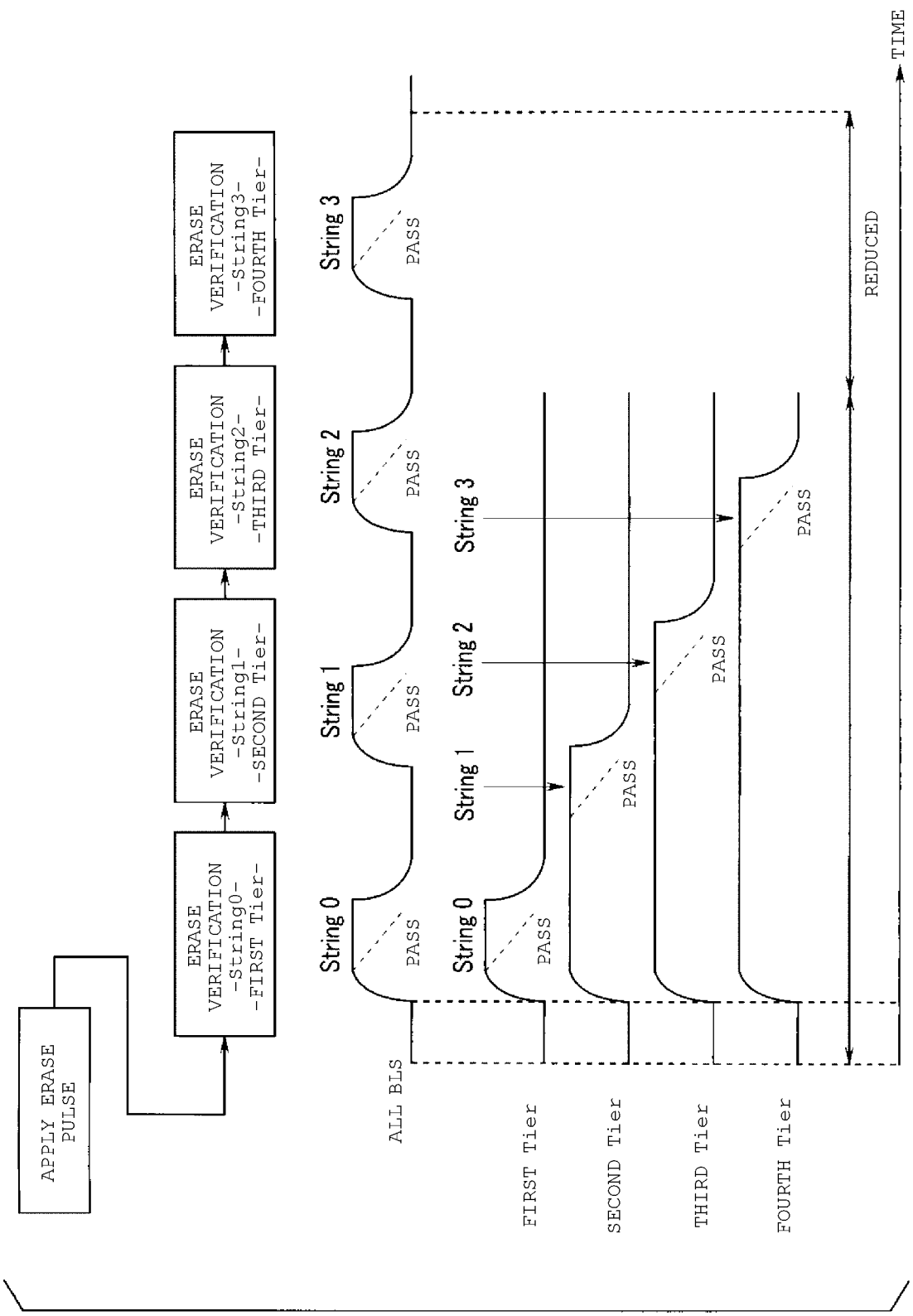
FIG. 14 is a waveform diagram illustrating a voltage change of a sense node of a sense amplifier at a time of erase verification.

Next, an operation according to an embodiment configured in this manner will be described with reference to FIGS. 13 and 14. FIG. 13 is a flowchart of an erase verification operation according to an embodiment. FIG. 14 is a waveform diagram illustrating a voltage change of the sense node of the sense amplifier 24 at time of the erase verification. In FIG. 14, a broken line portion of a waveform indicates a voltage change (drop) of the sense node when erase of the NAND string is successful (passes), and a solid line portion of a waveform indicates a voltage change (drop) of the sense node when the erase of the NAND string is unsuccessful (fails).

The sequencer 27 controls each unit of the non-volatile memory 2 based on the flowchart in FIG. 13 and the erase sequence illustrated in the upper part in FIG. 14. That is, in step S1 in FIG. 13, the sequencer 27 controls the voltage generation circuit 28 to generate a high-voltage erase pulse and to apply the erase pulse to the source line SL. As a result, a charge accumulated in the charge storage film 336 of each memory cell transistor MT of the strings String0 to String3 in the target block BLK should be discharged.

Next, the sequencer 27 performs an erase verification operation in steps S2 to S6 in order to check whether or not the threshold voltage of the memory cell transistors MT actually reaches the Er state. The sequencer 27 controls the voltage generation circuit 28 to generate a voltage required for the erase verification, and supplies the voltage to the memory cell array 23, the sense amplifier 24, and the row decoder 25.

First, in step S2, the sequencer 27 causes the row decoder 25 to apply the voltage VSGS to the select gate transistor ST2 to be turned on, to apply the voltage VSGD to the select gate transistor ST1 of the string String0 to be turned on, and to apply the erase verification voltage VCG_ER to the gate of each memory cell transistor MT. The voltage VSS is applied to the gate of the select gate transistors ST1 of the strings String1 to String3 to be turned off.

The sequencer 27 fixes the bit line BL to a constant voltage (for example, 0.5 V) by the sense amplifier 24, and charges the voltage of the sense node to the predetermined pre-charge voltage Vpre. That is, as illustrated in FIG. 14, the bit line BL and the sense node are charged in all Tiers (the first to fourth Tiers).

In the present embodiment, in step S2, only the sense node for the bit lines BL belonging to the first Tier are electrically connected to the bit lines BL. When the threshold voltage of all the memory cell transistors MT of the stings of the string unit SU0 that are connected to those bit lines BL belonging to the first Tier are in the Er state, all the memory cell transistors MT are in the on state, and a large cell current flows through the memory cell transistors MT, and the voltage of the sense node connected to the bit lines BL drops at a relatively high speed. Therefore, in this case, as illustrated by the broken line in FIG. 14, the voltage of the sense node becomes a voltage lower than a predetermined threshold voltage at a relatively early predetermined timing.

On the other hand, when the threshold voltage of any memory cell transistor MT of the string String0 connected to the predetermined bit line BL belonging to the first Tier is not returned to the Er state, the memory cell transistor MT is in the off state, and the voltage of the sense node connected to the predetermined bit line BL drops at a low speed. Therefore, in this case, as illustrated by the solid line in FIG. 14, the sense node still has a high voltage equal to or higher than the predetermined threshold voltage at a relatively early predetermined timing.

When the voltage of the sense node is lower than the predetermined threshold voltage at a predetermined timing, the sense amplifier 24 obtains a determination result indicating that the erase of the memory cell transistor MT of the string String0 connected to the bit line BL connected to the sense node is successful (the erase verification passes), and when the voltage of the sense node is equal to or higher than the predetermined threshold voltage, the sense amplifier 24 obtains a determination result indicating that the erase of the memory cell transistor MT of the string String0 is unsuccessful (the erase verification fails). The sense amplifier 24 outputs a success or failure determination result to the sequencer 27.

Next, the sequencer 27 performs the erase verification on the string String1 belonging to the second Tier in step S3. That is, in this case, the sequencer 27 causes the row decoder 25 to apply the voltage VSGD to the gate of the select gate transistor ST1 of the string String1 to be turned on, and to apply the voltage VSS to the gate of each select gate transistor ST1 of the strings String0, String1, and String3 to be turned off.

Since the bit line BL and the sense node are not discharged and data is not read at a time of a start of verification on the string String2, it is not necessary to perform the verification preparation process including recharging of the bit line BL and the sense node at a time of the start of the verification on the string String2.

The sequencer 27 electrically connects only the sense node connected to the bit line BL belonging to the second Tier to the bit line BL by the sense amplifier 24. As a result, the sense amplifier 24 obtains a determination result of whether or not the erasing of all the memory cell transistors MT of the string String1 belonging to the second Tier is successful. The sense amplifier 24 outputs the verification result of the erase verification to the sequencer 27.

After that, in the same manner, in step S4, the sense amplifier 24 obtains a determination result of whether or not erasing of all the memory cell transistors MT of the string String2 belonging to the third Tier is successful, and outputs the result to the sequencer 27. Next, in step S5, the sense amplifier 24 obtains a determination result of whether or not erasing of all the memory cell transistors MT of the string String3 belonging to the fourth Tier is successful, and outputs the result to the sequencer 27.

In step S6, the sequencer 27 determines whether or not all the verification results obtained in steps S2 to S5 indicate successful erase (the erase verification passes). When all are successful, the sequencer 27 ends the process. Otherwise, the sequencer 27 returns the process to step S1 and repeats the erase and the erase verification. In this case, among steps S2 to S5, only the step(s) for which the erase verification failed need to be re-executed.

The label "All BLs" in FIG. 14 indicates values for the erase verification described above for the related art, and the bit line BL and the sense node may be discharged by each verification of the strings String0 to String2. Therefore, it is necessary to execute the verification preparation process at a time of a start of each verification of the strings String1 to String3, and it takes a long time for the erase verification for this process. On the other hand, as illustrated in the first to fourth Tiers in FIG. 14, in the present embodiment, since the bit line BL and the sense node are not discharged and the data is not read at a time of the start of verification of the strings String2 to String3, it is not necessary to perform the verification preparation process including recharging of the bit line BL and the sense node at a time of the start of verification of each of the strings String1 to String3, and the erase verification can be speeded up.

The erase sequence illustrated in FIGS. 13 and 14 is an example, and the order of erase verification of each string String0 to String3 can be changed as appropriate.

In the above embodiment, since the erase verification is executed for each string unit in the block, one block is divided into the same number of Tiers as the number of string units and the erase verification is performed for each string unit and each Tier, and the number of Tier divisions is not limited thereto. For example, one block may be divided into a number of Tiers greater than the number of string units. Furthermore, in the present embodiment, for the memory cell transistor constituting the NAND strings connected to the same bit line, the verification is performed only once, so it is possible to remove the need for recharging the bit line and reduce the processing time for the erase verification, and the method of dividing sting units into the Tiers is not particularly limited. For example, the verification target of each string unit may be divided into different Tiers such that each individual Tier is a different, non-overlapping set of four adjacent bit lines. Thus, the four bit lines belonging to the same Tier within a string unit may be a verification target, and the erase verification may be performed only on the NAND strings connected to some bit lines BL among all the bit lines BL rather than all the NAND strings of the corresponding string unit.

In the present embodiment in this manner, when the memory cell transistor belonging to the block is verified, the memory cell transistor constituting the NAND string connected to the same bit line is verified by, for example, being verified only once, so that it is possible to omit the recharging of the bit line BL and the sense node required at the time of verification, and to reduce the time required for the erase verification. Even in this case, the erase verification is performed for each of all the string units in the block, and it is possible to obtain an approximately accurate verification result.

Modification Example 1-1

Figure 15:
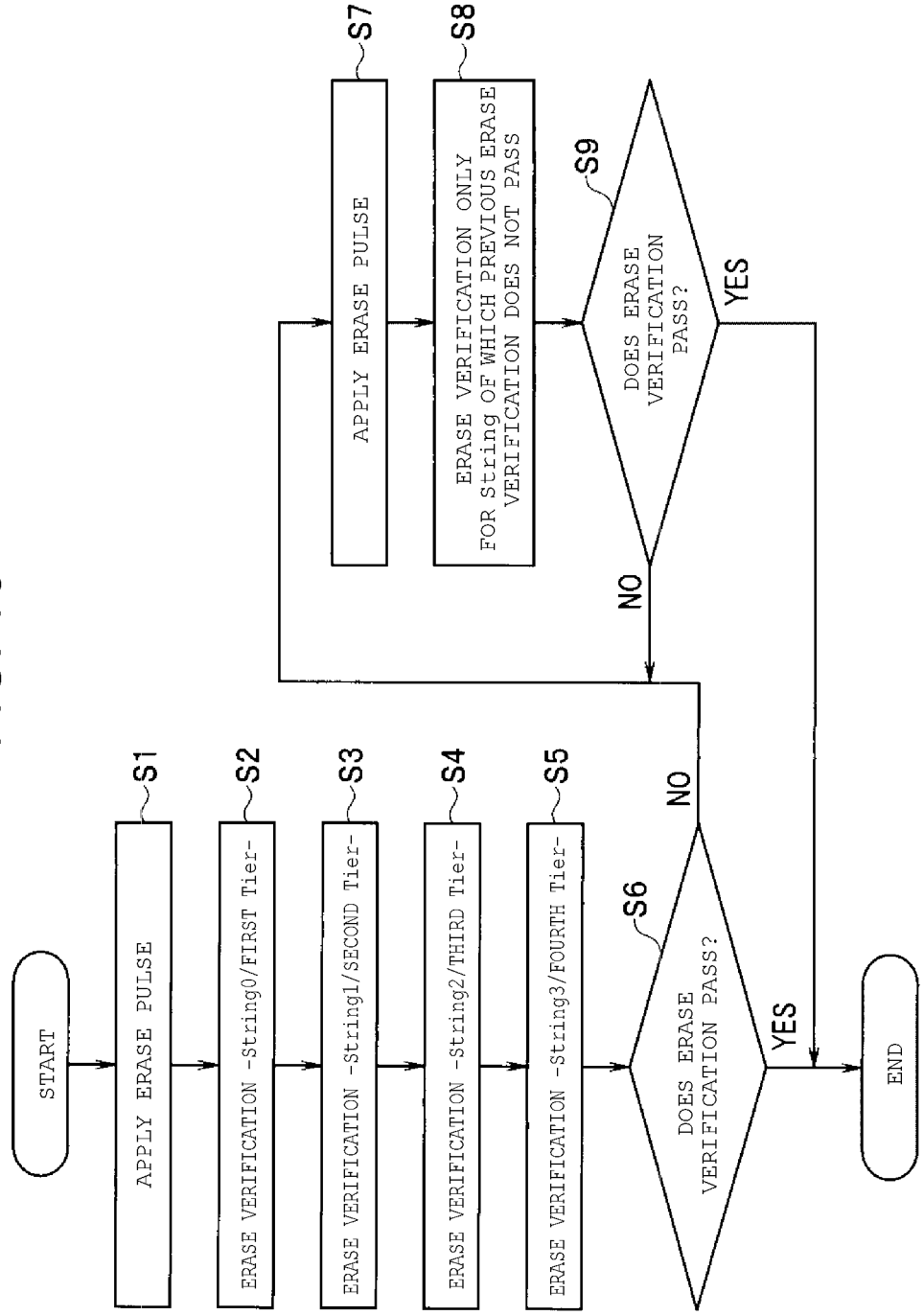
FIG. 15 is a flowchart illustrating aspects of Modification Example 1-1.

FIG. 15 is a flowchart illustrating Modification Example 1-1 of the first embodiment. In FIG. 15, an identical procedure as in FIG. 13 is designated by identical reference numerals and additional description thereof will be omitted. In the present modification example, in the second and subsequent erase verifications according to the first embodiment, erase verification is performed only for strings that did not pass verification (the verification-passed strings are omitted).

In step S6 in FIG. 15, when a verification result obtained in steps S2 to S5 does not indicate that all erases are successful (erase verifications pass), the sequencer 27 shifts the process to step S7, and applies an erase pulse and repeats erasing. Next, the sequencer 27 performs erase verification in step S8. In this case, the sequencer 27 performs the erase verification only for the strings for which a result of the previous erase verification indicates that the erase verification failed. As a result, the total time required for erase verification can be reduced. In step S9, the sequencer 27 determines whether or not the erase verification passes for all the tested strings. The sequencer 27 ends the process when the erase verification pass is obtained for all the tested strings, and repeats steps S8 to S9 otherwise.

In the present modification example in this manner, the time required for erase verification can be further reduced.

Modification Example 1-2

Figure 16:
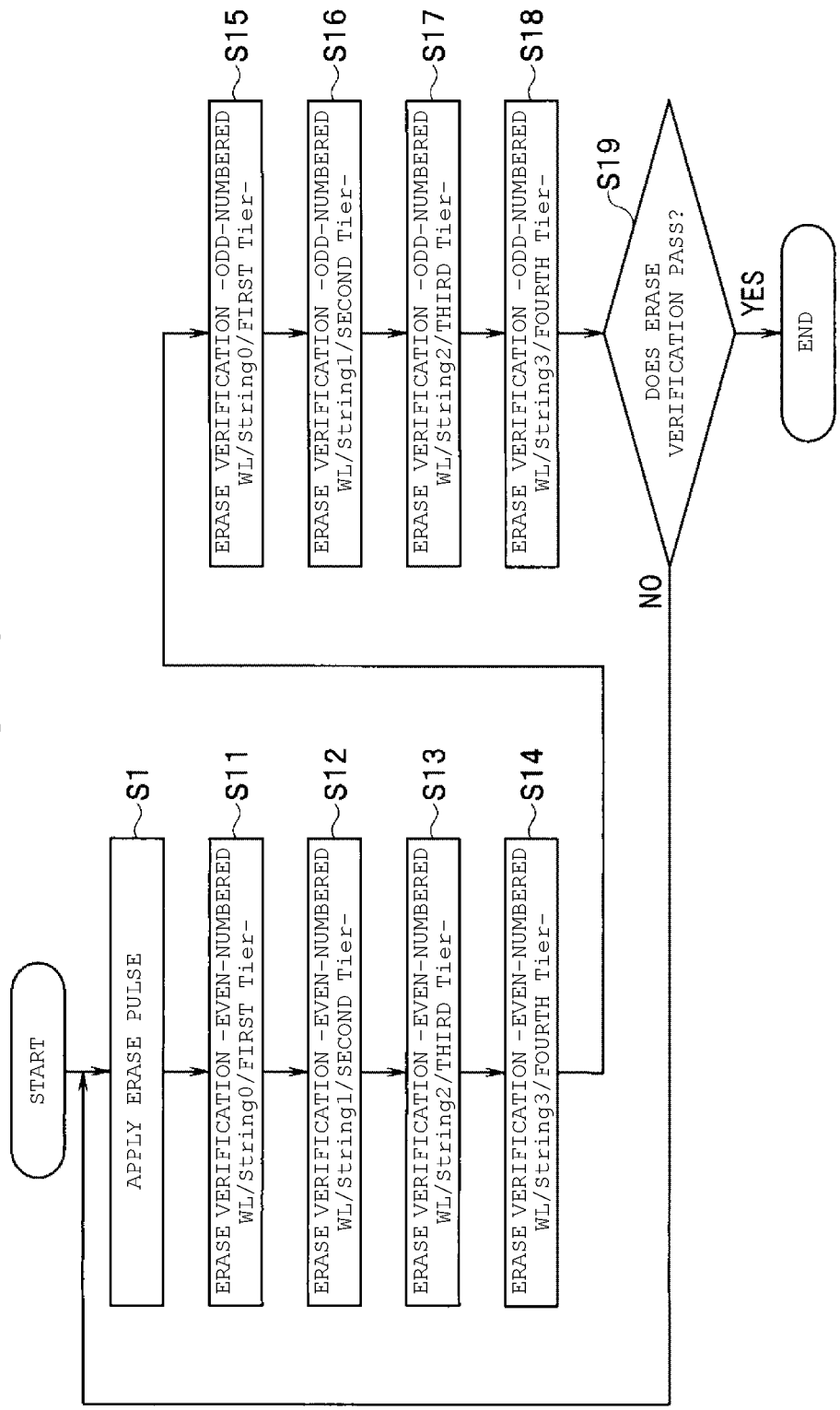
FIG. 16 is a flowchart illustrating aspects of Modification Example 1-2.
Figure 17:
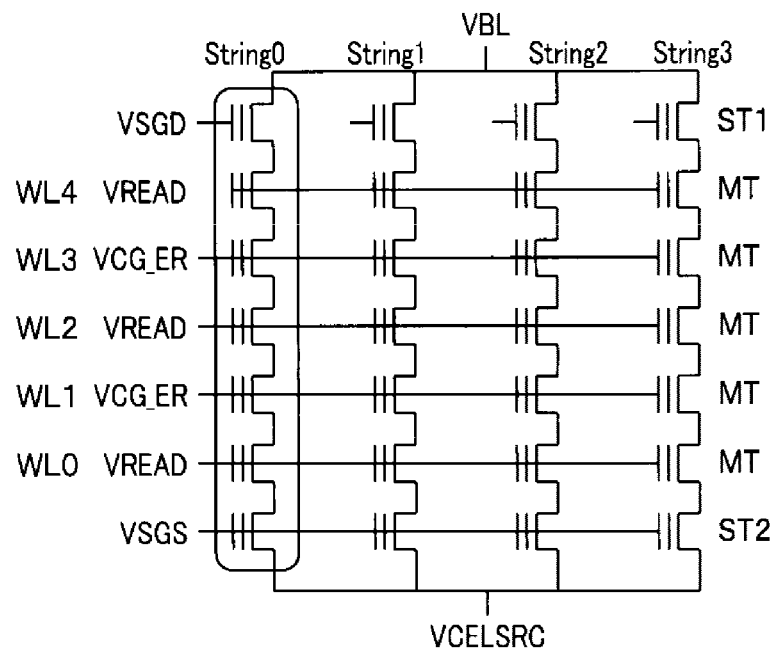
FIG. 17 is a diagram illustrating an applied voltage at a time of erase verification on an odd-numbered word line.
Figure 18:
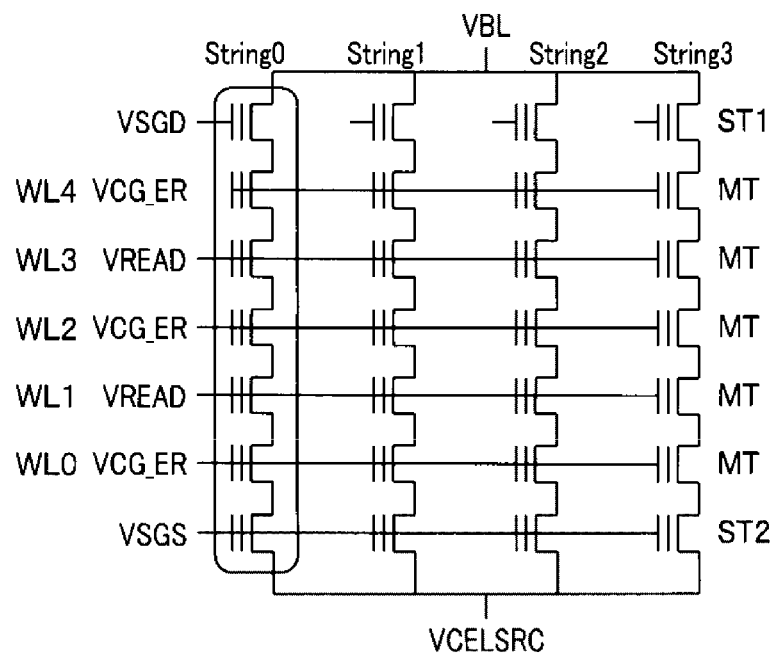
FIG. 18 is a diagram illustrating an applied voltage at a time of erase verification on an even-numbered word line.
Figure 19:
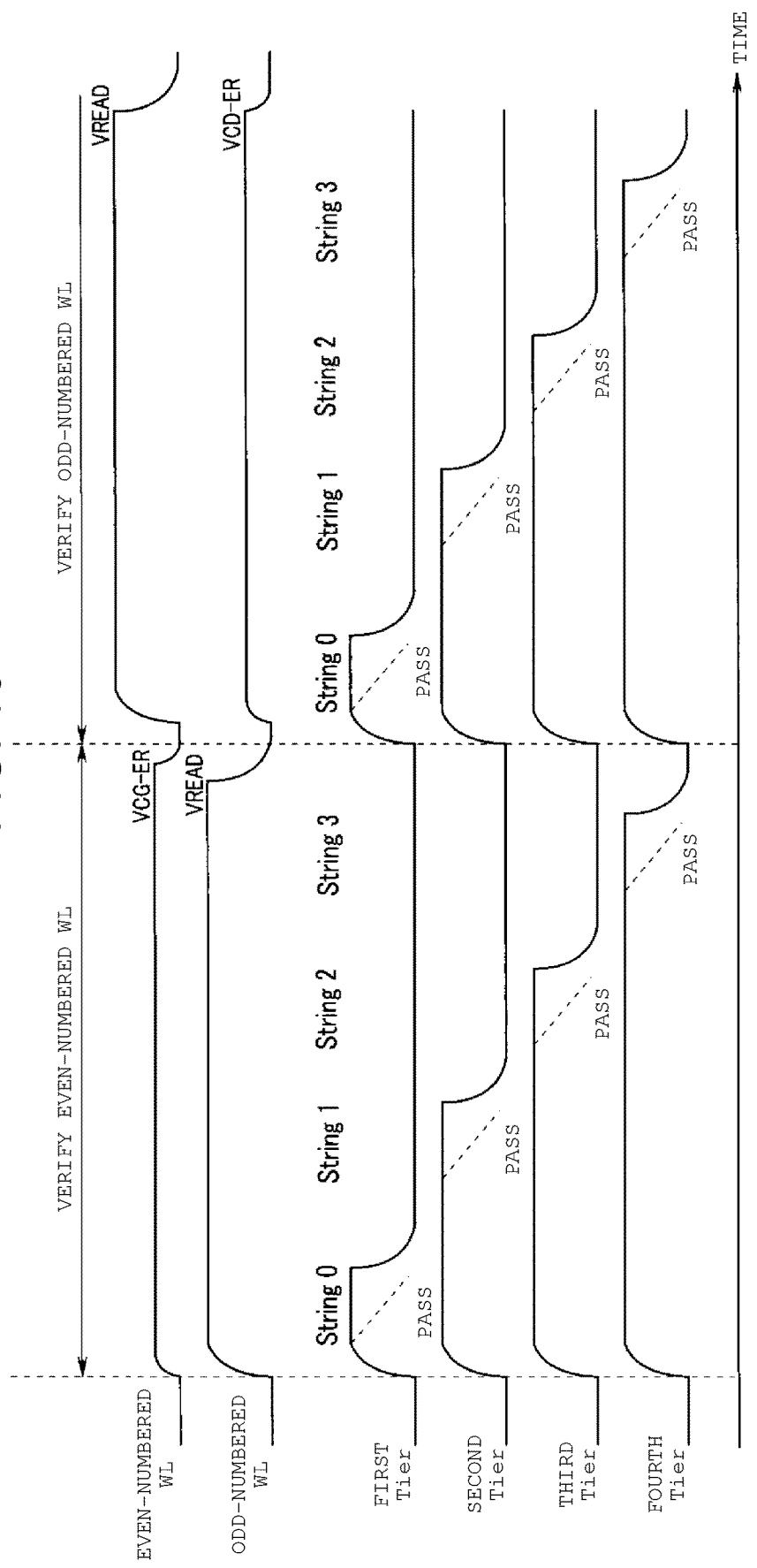
FIG. 19 is a waveform diagram related to Modification Example 1-2.

FIGS. 16 to 19 relate to Modification Example 1-2 of the first embodiment. FIG. 16 is a flowchart illustrating Modification Example 1-2 of the first embodiment, FIG. 17 is a circuit diagram illustrating an applied voltage at a time of erase verification on an odd-numbered word line, and FIG. 18 is a circuit diagram illustrating an applied voltage at a time of erase verification on an even-numbered word line. Further, FIG. 19 is a waveform diagram illustrating a voltage change of the sense node of the sense amplifier 24 at a time of erase verification by a description identical with FIG. 14. The present modification example indicates an example in which erase verification according to the first embodiment is divided into the memory cell transistor MT connected to an odd-numbered word line and the memory cell transistor MT connected to an even-numbered word line.

As illustrated in FIG. 17, when the memory cell transistor MT connected to the odd-numbered word line is verified (hereinafter, referred to as verification on the odd-numbered word line), FIG. 17 is different from the voltage application state in FIG. 9 in that the sufficiently high voltage VREAD required to turn on each memory cell transistor MT connected to the even-numbered word line is applied to the even-numbered word line. On the contrary, when the memory cell transistor MT connected to the even-numbered word line is verified (hereinafter, referred to as verification on the even-numbered word line), FIG. 18 is different from the voltage application state in FIG. 9 in that the sufficiently high voltage VREAD required to turn on each memory cell transistor MT connected to the odd-numbered word line is applied to the odd-numbered word line.

FIG. 16 illustrating an erase sequence according to the present modification example is identical with FIG. 13 except that erase verification on strings in each Tier is divided into an even-numbered word line group and an odd-numbered word line group. That is, when an erase pulse is applied in step S1 in FIG. 16, the sequencer 27 turns on only the select gate transistor ST1 of the string String0 of each select gate transistor ST1 by the row decoder 25 in step S11 in FIG. 16, and the erase verification voltage VCG_ER is applied to the even-numbered word line (WL), and the voltage VREAD is applied to the odd-numbered word line (WL), as illustrated in FIG. 19. Further, the sequencer 27 performs the verification preparation process by the sense amplifier 24.

In step S11, the sense amplifier 24 electrically connects only the sense node connected to the bit line BL belonging to the first Tier, to the bit line BL. Thus, a cell current flows according to the threshold voltage of the memory cell transistor MT connected to the even-numbered WL among the memory cell transistors MT of the string String0 connected to the predetermined bit line BL belonging to the first Tier. As a result, the sense amplifier 24 determines whether or not the erasing is successful for the memory cell transistor MT connected to the even-numbered WL of the string String0 belonging to the first Tier.

Next, in step S12, the sequencer 27 causes the row decoder 25 to turn on only the select gate transistor ST1 of the string String1 among the respective select gate transistors ST1. In step S12, the sequencer 27 electrically connects only the sense node connected to the bit line BL belonging to the second Tier, to the bit line BL. A cell current flows according to the threshold voltage of the memory cell transistor MT connected to the even-numbered WL among the memory cell transistors MT of the string String1 connected to the predetermined bit line BL belonging to the first Tier. As a result, the sense amplifier 24 determines whether or not the erasing is successful for the memory cell transistor MT connected to the even-numbered WL of the string String1 belonging to the second Tier.

In step S11, since the string String1 is not a target for the erase verification, and the bit line BL and the sense node are not discharged (FIG. 19), in the same manner as the first embodiment, it is not necessary to perform the verification preparation process at the time of erase verification on the string String1. The same applies to the following steps S13 and S14.

In the same manner thereafter, the sense amplifier 24 determines whether or not the erase of the memory cell transistor MT connected to the even-numbered WL of the string String1 belonging to the third Tier is successful in step S13, and determines whether or not the erase is successful for the memory cell transistor MT connected to the even-numbered WL of the string String3 belonging to the fourth Tier in step S14.

Further, in step S15, the sense amplifier 24 causes the row decoder 25 to turn on only the select gate transistor ST1 of the string String0 among the respective select gate transistors ST1, and as illustrated in FIG. 19, the erase verification voltage VCG_ER is applied to the odd-numbered word line (WL), and the voltage VREAD is applied to the even-numbered word line (WL). Since the erase verification for the first Tier of the string String0 is the second time, the sequencer 27 causes the sense amplifier 24 to perform the verification preparation process as illustrated in FIG. 19.

In step S15, the sense amplifier 24 electrically connects only the sense node connected to the bit line BL belonging to the first Tier, to the bit line BL. Thus, a cell current flows according to the threshold voltage of the memory cell transistor MT connected to the odd-numbered WL among the memory cell transistors MT of the string String0 connected to the predetermined bit line BL belonging to the first Tier. As a result, the sense amplifier 24 determines whether or not the erasing is successful for the memory cell transistor MT connected to the odd-numbered WL of the string String0 belonging to the first Tier.

Next, in step S16, the sequencer 27 causes the row decoder 25 to turn on only the select gate transistor ST1 of the string String1 among the respective select gate transistors ST1. In step S16, the sequencer 27 electrically connects only the sense nodes connected to the bit lines BL belonging to the second Tier to the bit lines BL. A cell current flows according to the threshold voltage of the memory cell transistor MT connected to the odd-numbered WL among the memory cell transistors MT of the string String1 connected to the predetermined bit line BL belonging to the second Tier. As a result, the sense amplifier 24 determines whether or not the erasing is successful for the memory cell transistor MT connected to the odd-numbered WL of the string String1 belonging to the second Tier.

In step S15, the string String1 is not a target for the erase verification, and the voltage of the sense node is not lowered (FIG. 19), so that it is not necessary to perform the verification preparation process at the time of erase verification on the string String1. The same applies to the following steps S17 and S18.

In the same manner thereafter, the sense amplifier 24 determines whether or not the erase of the memory cell transistor MT connected to the odd-numbered WL of the string String1 belonging to the third Tier is successful in step S17, and determines whether or not the erase is successful for the memory cell transistor MT connected to the odd-numbered WL of the string String3 belonging to the fourth Tier in step S18.

Other actions are the same as FIG. 13. In the present modification example as well, the erase sequence may be set as appropriate. For example, the erase verification may be performed in order of steps S11, S15, S12, S16, S13, S17, S14, and S18 in FIG. 16.

In the present modification example in this manner as well, the same effect as that of the first embodiment can be obtained.

Second Embodiment

Figure 20:
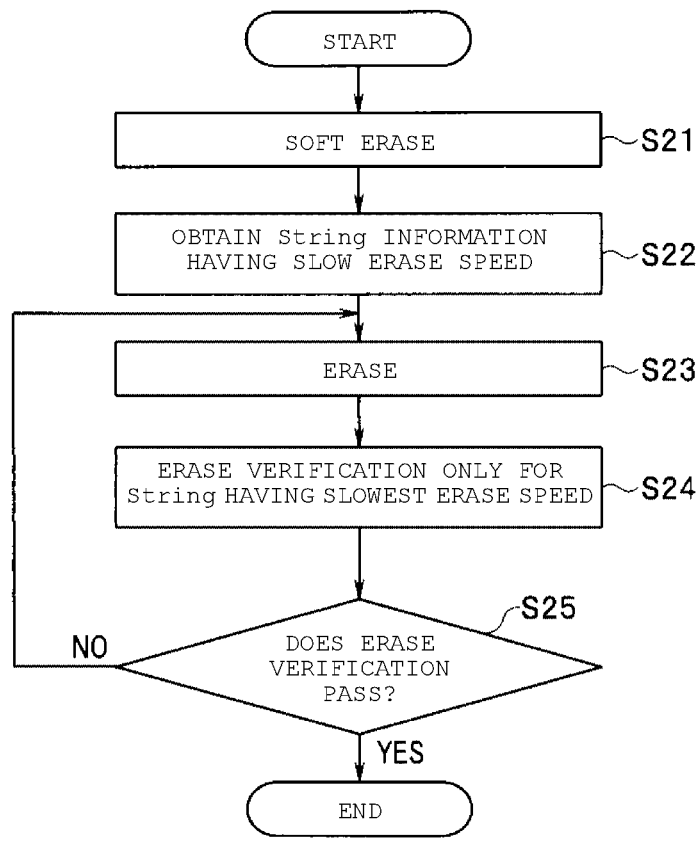
FIG. 20 is a flowchart illustrating an operation flow adopted in a second embodiment.

FIG. 20 is a flowchart illustrating an operation flow adopted in a second embodiment. A hardware configuration in the present embodiment is identical with the hardware configuration in the first embodiment illustrated in FIGS. 1 to 7.

Due to the manufacturing step of the non-volatile memory 2, the erase characteristics differ for each memory cell transistor MT, and in particular, as described above, the erase characteristics differ relatively greatly for each string unit SU. For example, even when erasing is performed by using erase pulses of identical states, there are variations in the amount of decrease in the threshold voltage of the memory cell transistor MT. In the present embodiment, in particular, the string unit SU of which threshold voltage is unlikely to decrease (hereinafter, also referred to as a slow erase speed) is detected or estimated, and erase verification is performed only on a string unit having the slowest erase speed, and the erase verification result for all the string units is estimated from the result. As a result, it possible to reduce the processing time for the erase verification.

Figure 21:
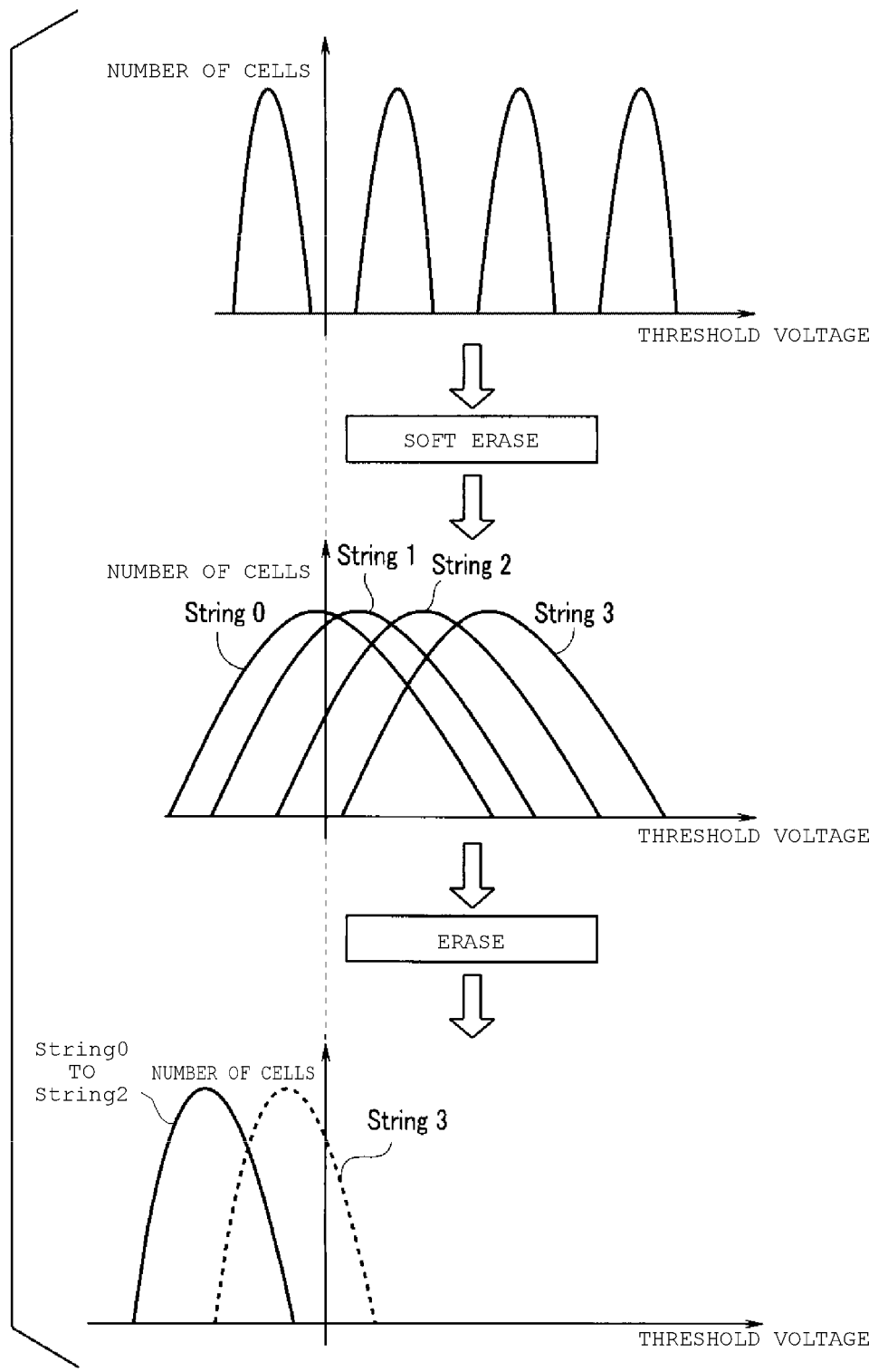
FIG. 21 is an explanatory view illustrating an outline of an erasing process according to a second embodiment.

FIG. 21 is an explanatory view illustrating an outline of an erasing process according to the present embodiment. FIG. 21 illustrates an example when the non-volatile memory 2 is a NAND memory having a memory cell transistor capable of storing 2 bits per memory cell transistor, that is, a NAND memory of a multi-level cell (MLC) capable of storing 2-bit (4 values) data, but the present embodiment is not limited thereto.

The upper part in FIG. 21 illustrates distribution of a threshold voltage of the memory cell transistor MT by a description identical with FIG. 8. Each memory cell transistor MT in the block BLK to be erased has a threshold voltage belonging to any one of these threshold voltage distributions. In the example in FIG. 21, soft erase is performed so that an erase pulse having a lowEr state than a normal erase pulse (hereinafter, referred to as a soft erase pulse) is applied to the source line SL of the erase target block BLK in order to detect the string unit having the slowest erase speed.

Since the (erasing) voltage of the soft erase pulse is lower than the (erasing) voltage of the normal erase pulse, the threshold voltage of the memory cell transistor MT is not sufficiently reduced. In this case, the threshold voltages of the strings String0 to String3 belonging to the string units SU0 to SU3 have the distribution illustrated in the middle part in FIG. 21 due to the variations in the erase speed for each string unit, for example. The example in FIG. 21 illustrates an example in which an erase speed of the string String0 is the fastest, followed by the erase speed of String1, String2, and String3 in this order. That is, in the example in FIG. 21, it is estimated that the erase speed of the string unit SU3 including the string String3 is the slowest.

Next, the erasing process is performed by using the normal level erase pulse. This result is illustrated in the lower part in FIG. 21, for example. The solid line at the bottom in FIG. 21 illustrates an example in which erasing of the string units SU0 to SU2 is successful, and the broken line indicates that the erasing of the string unit SU3 having the slowest erase speed fails. That is, by performing the erase verification only on the string unit SU3 having the slowest erase speed, it is possible to determine whether the erase was successful or unsuccessful.

The sequencer 27 executes erase and erase verification based on the flowchart in FIG. 20. In step S21 in FIG. 20, in order to detect a difference in erase speed for strings of each string unit, the sequencer 27 controls the voltage generation circuit 28 to generate a soft erase pulse having a voltage lower than the voltage used for the normal erase pulse, and perform soft erase to be applied to the source line SL. As a result, a charge accumulated in the charge storage film 336 of each memory cell transistor MT of the strings String0 to String3 in the target block BLK is discharged.

In the soft erase, the voltage level applied to the source line SL is not sufficiently high, so that the threshold voltage of the memory cell transistor MT does not drop to the Er state. As a result, variations occur in the distribution of the threshold voltage due to the difference in the erase speed for the strings of each string unit, as illustrated in the middle part in FIG. 21. As a result, it possible to detect the string String# having the slowest erase speed. In step S22, the sequencer 27 acquires information related to the string String# having the slowest erase speed.

For example, the sequencer 27 may perform verification by setting a level in the distribution of the string String3 which is higher than the distribution of the string String2 in FIG. 21 as a detection verification voltage. Thus, verification on each memory cell transistor MT of strings String0 to String2 passes, while verification on the string String3 fails. As a result, the sequencer 27 can determine that the string String3 has the slowest erase speed. Further, for example, the sequencer 27 may detect the string String# having the slowest erase speed while changing the detection verification voltage.

Figure 22:
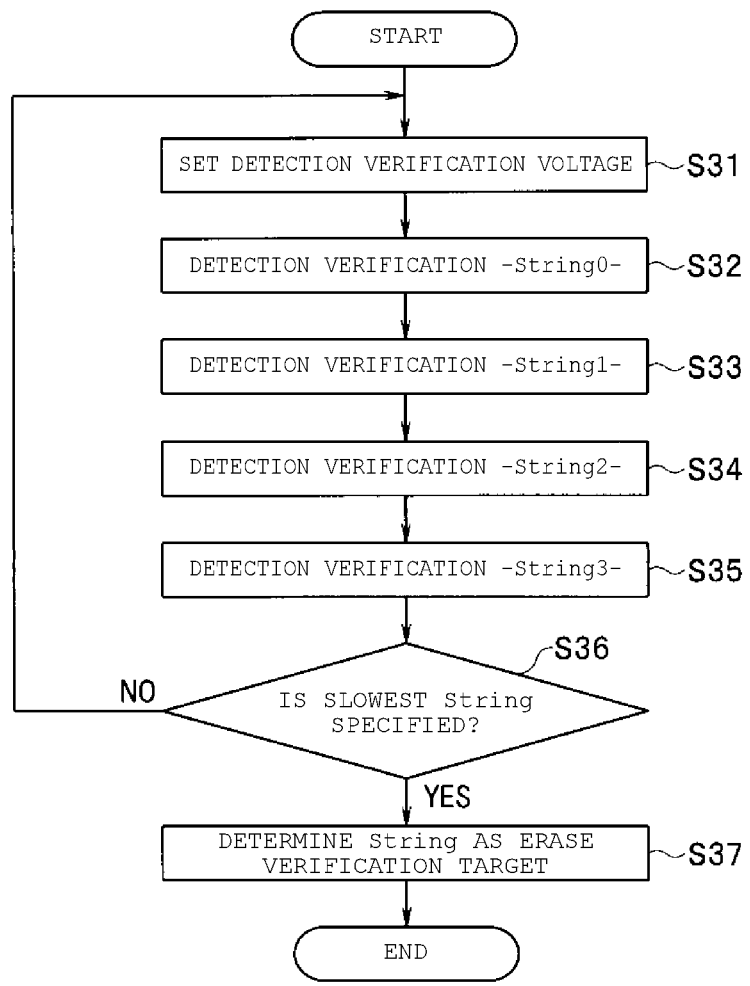
FIG. 22 is a flowchart illustrating an example of a process of step S22 in FIG. 20.

FIG. 22 is a flowchart illustrating an example of processes of step S22 in this case. The sequencer 27 sets the detection verification voltage in step S31. In this case, as described above, the sequencer 27 sets the detection verification voltage considered to be able to detect only the string having the slowest erase speed.

In step S32, the sequencer 27 sets the detection verification voltage to the word line WL, and uses the sense amplifier 24 to perform the detection verification on the string String0. In the same manner, in steps S33 to S35, the sequencer 27 subsequently performs detection verification on the strings String2 to String3 by using the sense amplifier 24.

In step S36, the sequencer 27 determines whether or not the string String# having the slowest erase speed can be specified based on the results of the detection verification in steps S32 to S35. Depending on the setting of the detection verification voltage, verification on only the string String# having the slowest erase speed fails and verification on the other strings String# passes, so that the sequencer 27 can specify the string String# having the slowest erase speed.

When the sequencer 27 cannot specify the string String# having the slowest erase speed, the sequencer 27 sets the detection verification voltage again based on the detection verification result (step S31). The sequencer 27 repeats the processes of steps S32 to S35. In this case, the detection verification may be performed only for the necessary string String# based on the result of the previous detection verification. The sequencer 27 determines the string String# specified as having the slowest erase speed in step S29 as the string String# to be erase-verified (step S30).

The sequencer 27 performs erasing in step S23 in FIG. 20. In this case, the sequencer 27 controls the voltage generation circuit 28 to generate the normal level erase pulse and apply the normal level erase pulse to the source line SL. As a result, a charge accumulated in the charge storage film 336 of each memory cell transistor MT of the strings String0 to String3 in the target block BLK is discharged.

Next, in step S24, the sequencer 27 performs erase verification only on the string String0 having the slowest erase speed detected in step S22. For example, assuming that the string String# having the slowest erase speed is the string String3, the sequencer 27 causes the row decoder 25 to apply the voltage VSGS to the select gate transistor ST2 and to turn on the select gate transistor ST2, to apply the voltage VSGD to the select gate transistor ST1 of the string String3 and to turn on the select gate transistor ST1, and to apply the erase verification voltage VCG_ER to the gate of each memory cell transistor MT. Regarding the select gate transistors ST1 of the strings String0 to String2, the voltage VSS is applied to the gate so as to turn off the select gate transistors ST1.

Further, the sequencer 27 performs the verification preparation process by the sense amplifier 24. The sense amplifier 24 electrically connects the sense node to the bit line BL under the control of the sequencer 27. In this manner, the sense amplifier 24 obtains a determination result of success or failure for erasing the memory cell transistor MT of the string String3 connected to the bit line BL.

The erase speed of the string String3 is the slowest, and when the erasing of the string String3 is successful, it can be considered that the erasing of the other strings String0 to String2 is also successful. When it is determined that the erasing of the string String3 fails, the sequencer 27 returns the process to step S23 and repeats erase and erase verification again (steps S23 and S24). Also in this case, the erase verification may be performed on only the string String# having the slowest erase speed. In this manner, the erase verification result of all the string units can be obtained by the erase verification for only one string String#.

In general, erase and erase verification are often performed a plurality of times. In the present embodiment, in this repeated plurality of times of erase verifications, since only one string String# is targeted, even when soft erase verification is performed, the processing time required for erase verification can be shortened as a whole.

In the present embodiment in this manner, the string String# having the slowest erase speed is detected prior to the normal erase, and the erase verification is performed only on the detected string String#. As a result, it is not necessary to perform erase verification for all the strings, so that the processing time required for erase verification can be reduced.

Modification Example 2-1

Figure 23:
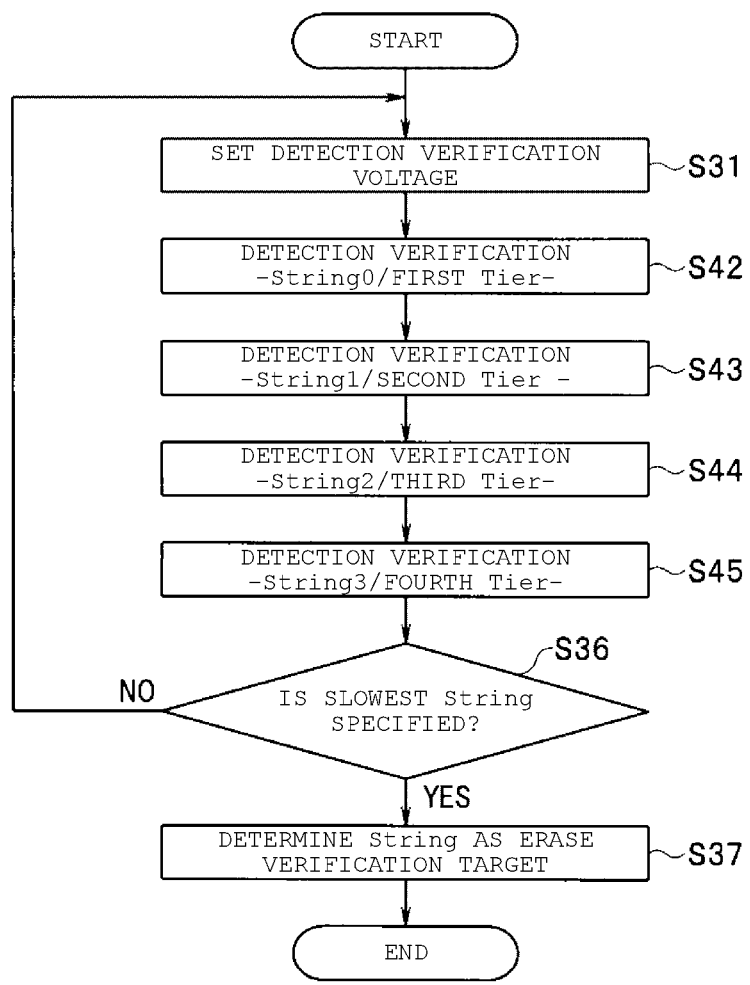
FIG. 23 is a flowchart illustrating aspects of Modification Example 2-1.

FIG. 23 is a flowchart of Modification Example 2-1 of the second embodiment. In Modification Example 2-1, the flow in FIG. 23 is adopted as step S22 in FIG. 20. In FIG. 23, an identical procedure as in FIG. 22 is designated by identical reference numerals and description thereof will be omitted.

In Modification Example 2-1, the method according to the first embodiment is adopted in detection verification, and a detection verification target of each string unit SU is set to the string String# of different Tiers.

When setting the detection verification voltage in step S31 in FIG. 23, in next step S42, the sequencer 27 causes the row decoder 25 to apply the voltage VSGS to the select gate transistor ST2 and turn on the select gate transistor ST2, to apply the voltage VSGD to the select gate transistor ST1 of the string String# and turn on the select gate transistor ST1, and to apply the detection verification voltage to the gate of each memory cell transistor MT. The voltage VSS is applied to the gate of the select gate transistors ST1 of the strings String1 to String3 to be turned off.

Further, the sequencer 27 performs the verification preparation process by the sense amplifier 24. That is, as illustrated in FIG. 14, the bit line BL and the sense node are charged in all Tiers (the first to fourth Tiers). In this state, the sense amplifier 24 electrically connects only the sense nodes connected to the bit lines BL belonging to the first Tier to the bit lines BL under the control of the sequencer 27. In this manner, in step S42, the sense amplifier 24 determines the success or failure of the soft erase for the string String0 belonging to the first Tier.

Next, in step S43, the sequencer 27 performs detection verification for the string String1 belonging to the second Tier. Since the bit line BL and the sense node belonging to the second Tier are not discharged in step S42, it is not necessary to execute the verification preparation process. The sequencer 27 causes the row decoder 25 to apply the voltage VSGD to the select gate transistor ST1 of the string String1 to be turned on, and to apply the voltage VSS to the gate of each select gate transistor ST1 of the strings String0, String1, and String3 to be turned off. Further, the sense amplifier 24 electrically connects only the sense node connected to the bit line BL belonging to the second Tier, to the bit line BL. In this manner, the sense amplifier 24 obtains a determination result of whether or not the soft erase of all the memory cell transistors MT of the string String1 belonging to the second Tier is successful.

In the same manner thereafter, the sense amplifier 24 obtains a determination result of whether or not the soft erase of all the memory cell transistors MT of the string String2 belonging to the third Tier is succeeded in step S44. Further, in step S45, the sense amplifier 24 obtains a determination result of whether or not the soft erase of all the memory cell transistors MT of the string String3 belonging to the fourth Tier is successful.

In the present modification example in this manner, the method of the first embodiment is adopted in the detection verification for detecting which string of the string units SU has the slowest erase speed, and the time required for detection verification can be shortened by eliminating the need for recharging the bit line BL and the sense node. As a result, in the present modification example, the processing time for erase verification can be further reduced.

Modification Example 2-2

Figure 24:
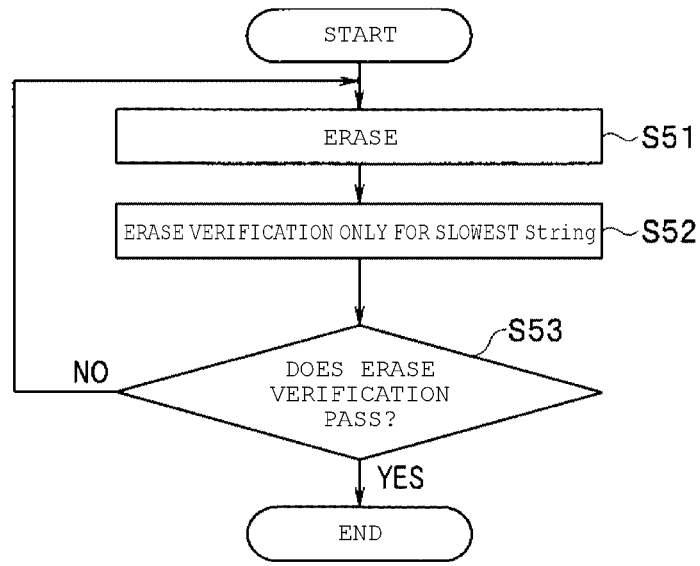
FIG. 24 is a flowchart illustrating aspects of Modification Example 2-2.

FIG. 24 is a flowchart of Modification Example 2-2 of the second embodiment. In Modification Example 2-2, the process of step S21 in FIG. 20 is omitted.

In Modification Example 2-1 of the second embodiment, an example in which the memory string having the slowest erase speed is detected by a soft erase and detection verification is described. Considering the manufacturing process of the memory cell transistors, it is possible to estimate which string in the block BLK will have the slowest erase speed. Furthermore, for a particular memory cell array 23, it may be expected that the string having the slowest erase speed will not change over time. Therefore, before shipping the product, it is possible to actually measure and detect the string having the slowest erase speed, or to otherwise estimate which string will be slowest without actually measuring the erase speeds for each string in the memory cell array 23. The information indicating the determined (measured or estimated) string having the slow erase speed can then be stored in a management area in the memory cell array 23 for future reference.

When the sequencer 27 performs erasing in step S51, in next step S52, previously stored information related to the string having the slowest erase speed can be acquired from the management area or the like, and erase verification can then be performed only for this slowest string. When the sequencer 27 determines that the erasing for this expected or known slowest string is successful (erase verification pass), the sequencer 27 determines that the erasing for the other (less slowly erasing) strings was also successful.

In this manner, in the present modification example, the string having the slowest erase speed is estimated or detected before the erasing process begins, this information is recorded, and the information is read at a time of erasing, so that it becomes possible to perform erase verification on just the slowest string rather than all the other strings. As a result, the processing time for erase verification can be further reduced.

Modification Example 2-3

Figure 25:
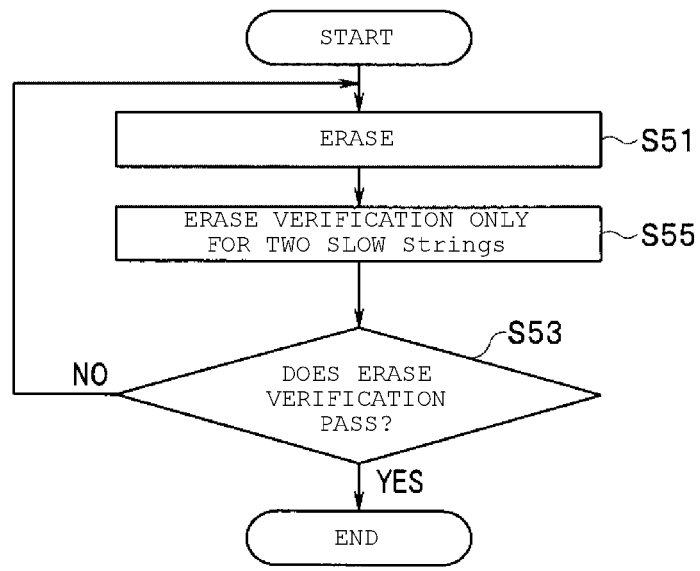
FIG. 25 is a flowchart illustrating aspects of Modification Example 2-3.

FIG. 25 is a flowchart of Modification Example 2-3 of the second embodiment. In Modification Example 2-3, step S55 is adopted instead of step S52 in FIG. 24. Step S55 is a process of performing erase verification only on the two strings String# having relatively slow erase speeds.

For a particular configuration of the string unit SU and the block BLK, it might be expected that, based just on the manufacturing process utilized, the erase speeds of two particular string units SU among the four total string units SU will be slower than erase speeds of the other two string units SU. Modification Example 2-3 take this case into consideration. For example, information indicating the two strings String# with a known or expected slow erase speeds can be recorded in a management area in the memory cell array 23.

In this case, the sequencer 27 performs erase verification only for the two strings String# having the known (based on the stored information in the management area or the like) slow erase speeds in step S55. When it is determined that the erasing of these two strings String# is successful, the sequencer 27 determines that the erasing of the remaining two strings String# was also successful. As a result, a time required for erase verification can be reduced.

Figure 26:
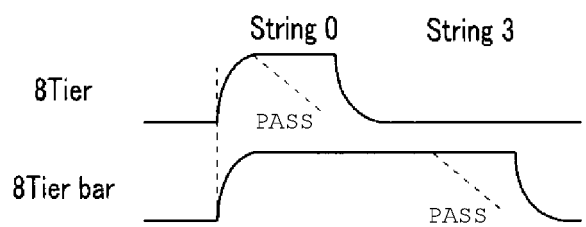
FIG. 26 is a waveform diagram illustrating a voltage change of the sense node.

Further, in the process of step S55 in FIG. 25, by applying the method of the first embodiment, it is possible to further reduce the time required for erase verification. FIG. 26 is a waveform diagram illustrating a voltage change of the sense node in this case by a description identical with FIG. 14. FIG. 26 illustrates an example in which a string unit is divided into 16 Tiers and erase verification is separately executed on 8 Tiers and the remaining 8 Tiers (8 Tiers bar) is described. That is, FIG. 26 illustrates a voltage change of the sense node connected to the bit line BL belonging to the 8 Tiers and a voltage change of the sense node connected to the bit line BL belonging to the other 8 Tiers bar. FIG. 26 illustrates an example in which two strings String# having slow erase speeds are the strings String0 and String3.

In the example in FIG. 26, the sequencer 27 first performs erase verification on String0 of 8 Tiers, which is half of all the string units SU, and then erase verification is executed on String3 of the remaining 8 Tiers. Since it is not necessary to perform the verification preparation process such as charging the corresponding bit line BL and the sense node when performing the erase verification on the remaining 8 Tiers, it is possible to reduce the time required for the erase verification.

In this manner, the processing time of erase verification can be reduced also in the present modification example.

Third Embodiment

Figure 27:
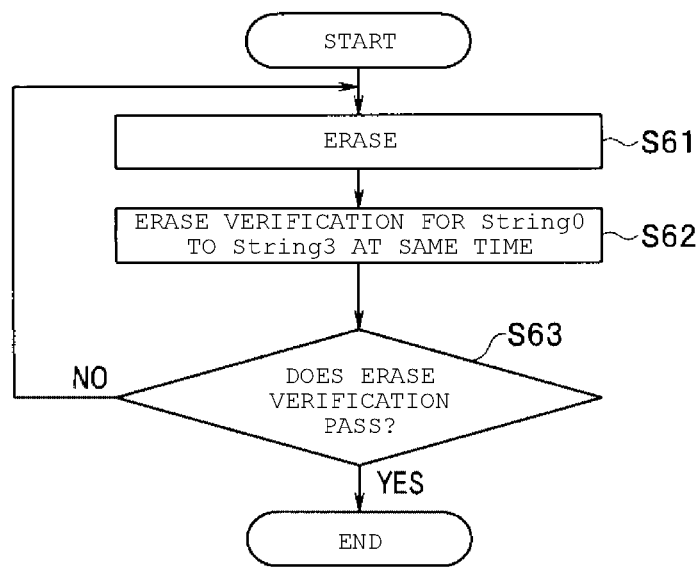
FIG. 27 is a flowchart illustrating an operation flow adopted in a third embodiment.

FIG. 27 is a flowchart illustrating an operation flow adopted in a third embodiment. A hardware configuration in the present embodiment is identical with the hardware configuration in the first embodiment illustrated in FIGS. 1 to 7.

In the present embodiment, a processing time for erase verification can be reduced by simultaneously performing the erase verification on a plurality of strings String# in the block BLK.

In step S61 in FIG. 27, the sequencer 27 controls the voltage generation circuit 28 to generate a high-voltage erase pulse and apply the high-voltage erase pulse to the source line SL. As a result, a charge accumulated in the charge storage film 336 of each memory cell transistor MT of the strings String0 to String3 in the target block BLK is discharged.

Next, the sequencer 27 performs erase verification in step S62 in order to check whether or not a threshold voltage of the memory cell transistor MT reaches the Er state. The sequencer 27 controls the voltage generation circuit 28 to generate a voltage required for the erase verification, and supplies the voltage to the memory cell array 23, the sense amplifier 24, and the row decoder 25.

In the present embodiment, in step S62, the sequencer 27 causes the row decoder 25 to apply the voltage VSGS to the select gate transistor ST2 and turn on the select gate transistor ST2, to apply the voltage VSGD to the select gate transistors ST1 of all the strings String0 to String3 and turn on the select gate transistors ST1, and to apply the erase verification voltage VCG_ER to the gate of each memory cell transistor MT. As a result, it is possible to perform the erase verification on all the strings String0 to String3.

The sequencer 27 performs the verification preparation process by the sense amplifier 24. In this state, the sense amplifier 24 electrically connects the sense node to the bit line BL under the control of the sequencer 27.

As a result, when the threshold voltages of all the memory cell transistors MT of all String0 to String3 are in the Er state, all these memory cell transistors MT are in the on state, a large cell current flows through the memory cell transistor MT, and a voltage of the sense node drops at a relatively high speed. Therefore, in this case, the sense node has a voltage lower than a predetermined threshold voltage at a relatively early predetermined timing.

On the other hand, when the threshold voltage of any one of the memory cell transistors MT does not return to the Er state in all String0 to String3, the memory cell transistor MT is in the off state, and the current does not flow in all the strings String0 to String3, and the voltage of the sense node drops at a low speed. Therefore, in this case, the sense node still remains at the voltage equal to or higher than the predetermined threshold voltage at a relatively early predetermined timing.

The sense amplifier 24 outputs the verification result in accordance with the voltage level of the sense node at a predetermined timing to the sequencer 27. In step S63, the sequencer 27 determines whether or not the erase verification passes. When the determination result of the erase verification is an erase verification fail indicating that the erase fails, the sequencer 27 returns the process to step S61 and repeats erase and erase verification.

When any one of the strings String# in the block BLK is in the erase state without a write being performed, regardless of a state of the other strings String#, the sense amplifier 24 determines whether or not the erase verification passes. When a random program method is adopted, it is difficult to assume such a state. In the present embodiment, in the non-volatile memory 2 adopting the random program method, it is effective in reducing the processing time of erase verification.

In this manner, in the present embodiment, the erase verification is performed with respect to each string String# in the block BLK at the same time, and there is an advantage that the time required for the erase verification can be reduced.

Modification Example 3-1

Figure 28:
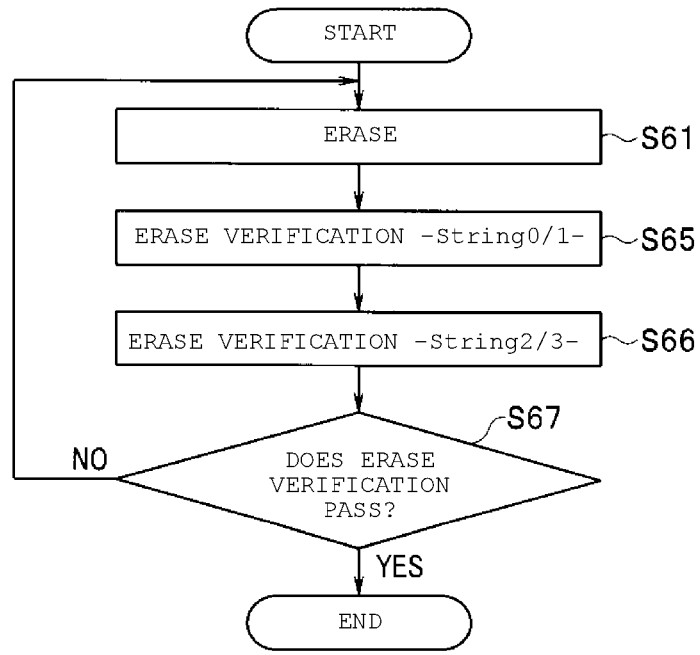
FIG. 28 is a flowchart illustrating aspects of Modification Example 3-1.

FIG. 28 is a flowchart of Modification Example 3-1 of the third embodiment. In Modification Example 3-1, steps S65 and S66 are adopted instead of step S62 in FIG. 27. In the erase sequence in FIG. 27, an example of simultaneously performing erase verification on all the strings String# is described. In present Modification Example 3-1, by reducing the number of strings on which the erase verification is performed at the same time, it is possible to perform more reliable erase verification.

The sequencer 27 is different from the erase sequence in FIG. 27 in that the verification on the strings String0 to String3 is divided into two and executed. That is, the sequencer 27 simultaneously performs the erase verification on the strings String0 and String1 in step S65 in FIG. 28, and simultaneously performs the erase verification on the strings String2 and String3 in step S66.

That is, in step S65, the sequencer 27 causes the row decoder 25 to apply the voltage VSGS to the select gate transistor ST2 and turn on the select gate transistor ST2, to apply the voltage VSGD to the select gate transistors ST1 of the strings String0 and String1 and turn on the select gate transistors ST1, and to apply the erase verification voltage VCG_ER to the gate of each memory cell transistor MT. The voltage VSS is applied to the gate of each select gate transistor ST1 of the strings String2 and String3 to be turned off. As a result, it is possible to perform the erase verification on only the strings String0 and String1.

Further, in step S66, the sequencer 27 causes the row decoder 25 to apply the voltage VSGD to the select gate transistors ST1 of the strings String2 and String3 and turn on the select gate transistors ST1, and to apply the voltage VSS to the gate for each select gate transistor ST1 of the strings String0 and String1 to be turned off. As a result, it is possible to perform the erase verification on only the strings String2 and String3. The sense amplifier 24 outputs the erase verification result to the sequencer 27.

In step S67, the sequencer 27 determines whether or not the erase verification on all the strings String0 to String3 passes, as a result of the erase verification in steps S65 and S66. When the erase verification on all of the strings String0 to String3 does not pass, the sequencer 27 returns the process to step S61 and repeats erase and erase verification. In this case, the erase verification is performed again only for the string String# set determined to have an erase fail (erase verification fails) in the previous erase verification.

Other actions are the same as in the third embodiment.

In this manner, in the present modification example, the erase verification, which is performed for each string String# in the related art, can be performed twice, and the processing time for the erase verification can be reduced.

Modification Example 3-2

Figure 29:
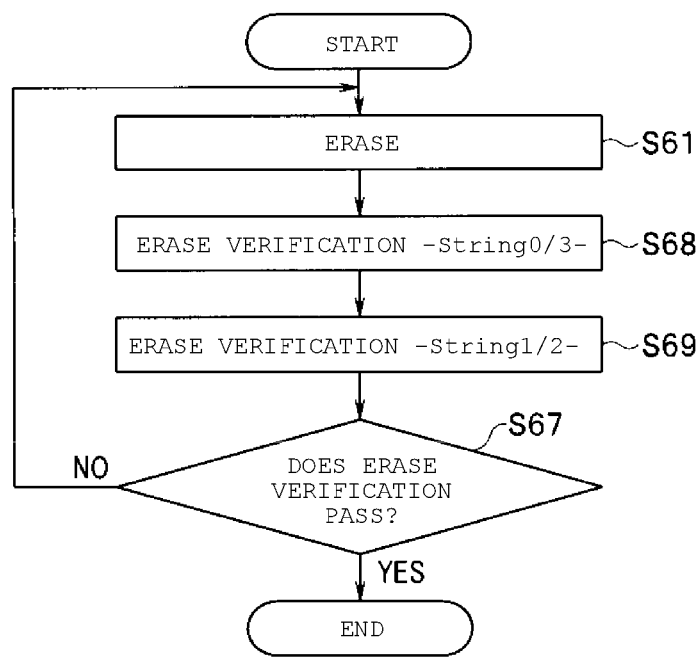
FIG. 29 is a flowchart illustrating aspects of Modification Example 3-2.

FIG. 29 is a flowchart of Modification Example 3-2 of the third embodiment. In Modification Example 3-2, steps S68 and S69 are adopted instead of steps S65 and S66 in FIG. 28. In Modification Example 3-1 in FIG. 28, the respective strings String# in one block BLK are divided into a plurality of sets, and erase verification is performed for each set, and the combination of the strings String# can be appropriately set. For example, a set on which the erase verification is to be simultaneously performed may be selected according to an erase speed characteristic.

Modification Example 3-2 in FIG. 29 is different from the erase sequence in FIG. 28 in that erase verification is executed twice on a set including the strings String0 and String3 and a set including the strings String1 and String2.

That is, the sequencer 27 simultaneously performs the erase verification on the strings String0 and String3 in step S68 in FIG. 29, and simultaneously performs the erase verification on the strings String1 and String2 in step S69.

That is, in step S68, the sequencer 27 applies the voltage VSGD to the select gate transistors ST1 of the strings String0 and String3 to be turned on, and applies the voltage VSS to the gate of each select gate transistors ST1 of the strings String1 and String2 to be turned off. As a result, it is possible to perform the erase verification on only the strings String0 and String3.

Further, in step S69, the sequencer 27 applies the voltage VSGD to the select gate transistors ST1 of the strings String1 and String2 to be turned on, and applies the voltage VSS to the gate of each select gate transistor ST1 of the strings String0 and String3 to be turned off. As a result, it is possible to perform the erase verification on only the strings String1 and String2.

Other actions are the same as in Modification Example 3-1 in FIG. 28.

In this manner, also in the present modification example, the erase verification, which is performed for each string String# in the related art, can be performed twice, and the processing time for the erase verification can be reduced.

Modification Example 1-3

Figure 30:
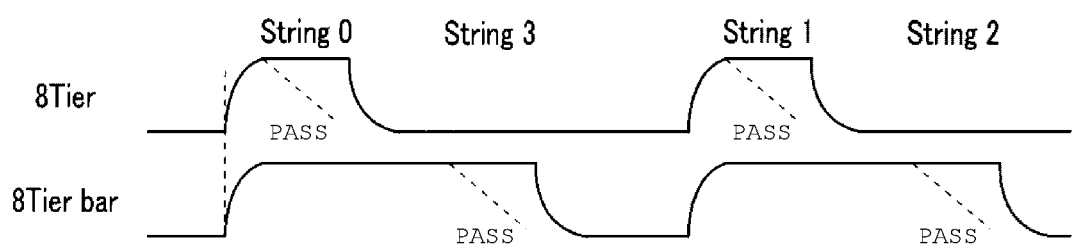
FIG. 30 is a waveform diagram illustrating aspects related to Modification Example 1-3.

FIG. 30 is a waveform diagram illustrating Modification Example 1-3 of the first embodiment, and illustrates a voltage change of the sense node by a description identical with FIG. 26. In Modification Example 1-3, the method of the first embodiment is applied to each set including the strings String# in Modification Examples 3-1 and 3-2, and the first embodiment is applied to the erase verification process of steps S65 and S66 in FIG. 28 or steps S68 and S69 in FIG. 29.

In present Modification Example, an example in which a string unit is divided into 16 Tiers, and erase verification is separately executed on the 8 Tiers and the remaining 8 Tiers ("8 Tiers bar"), and the erase verification process is performed on a set including the strings String0 and String3 and a set including the strings String1 and String2 is described. The set including the strings String# can be changed as appropriate.

That is, in the example in FIG. 30, the sequencer 27 first generates a high-voltage erase pulse and applies the high-voltage erase pulse to the source line SL. As a result, a charge accumulated in the charge storage film 336 of each memory cell transistor MT of the strings String0 to String3 in the target block BLK is discharged.

Next, the sequencer 27 performs erase verification. In this case, the sequencer 27 applies the voltage VSGD to the select gate transistor ST1 of the string String0 to be turned on, and applies the voltage VSS to the gate of each select gate transistor ST1 of the other strings String1 to String3 to be turned off. As a result, it is possible to perform the erase verification on only the string String0.

Further, the sequencer 27 performs the verification preparation process by the sense amplifier 24. That is, as illustrated in FIG. 30, the bit line BL and the sense node are charged at all Tiers (8 Tiers and 8 Tiers bar). In this state, the sense amplifier 24 electrically connects the sense node connected to the bit line BL belonging to the 8 Tiers to the bit line BL under the control of the sequencer 27.

As a result, for String0 corresponding to the 8 Tiers, the voltage of the corresponding sense node changes according to the threshold voltage of the memory cell transistor MT, and erase verification is performed.

Next, the sequencer 27 applies the voltage VSGD to the select gate transistor ST1 of the string String3 to be turned on, and applies the voltage VSS to the gate of each select gate transistor ST1 of the other strings String0 to String2. As a result, it is possible to perform the erase verification on only the string String3. At this point, the bit line BL and the sense node belonging to the 8 Tiers bar are not discharged, so there is no need to recharge the bit line BL and the sense node. In this state, the sense amplifier 24 electrically connects the sense node connected to the bit line BL belonging to the 8 Tiers bar to the bit line BL under the control of the sequencer 27. As a result, for String3 corresponding to the 8 Tiers bar, the voltage of the corresponding sense node changes according to the threshold voltage of the memory cell transistor MT, and erase verification is performed.

Next, the sequencer 27 applies the voltage VSGD to the select gate transistor ST1 of the string String1 to be turned on, and applies the voltage VSS to the gate of each select gate transistor ST1 of the other strings String0, String2, and String3 to be turned off. As a result, it is possible to perform the erase verification on only the string String1.

Further, the sequencer 27 performs the verification preparation process by the sense amplifier 24. That is, as illustrated in FIG. 30, the sense node connect to the bit line BL is charged at all Tiers (8 Tiers and 8 Tiers bar). In this state, the sense amplifier 24 electrically connects the sense node connected to the bit line BL belonging to the 8 Tiers to the bit line BL under the control of the sequencer 27.

As a result, for String1 corresponding to the 8 Tiers, the voltage of the corresponding sense node changes according to the threshold voltage of the memory cell transistor MT, and erase verification is performed.

Next, the sequencer 27 applies the voltage VSGD to the select gate transistor ST1 of the string String2 to be turned on, and applies the voltage VSS to the gate of each select gate transistor ST1 of the strings String0, String1, and String3 to be turned off. As a result, it is possible to perform the erase verification on only the string String2. At this point, the bit line BL and the sense node belonging to the 8 Tiers bar are not discharged, so there is no need to recharge the bit line BL and the sense node. In this state, the sense amplifier 24 electrically connects the sense node connected to the bit line BL belonging to the 8 Tiers bar to the bit line BL under the control of the sequencer 27. As a result, for String2 corresponding to the 8 Tiers bar, the voltage of the corresponding sense node changes according to the threshold voltage of the memory cell transistor MT, and erase verification is performed.

Other actions are the same as in the first embodiment.

In this manner, a processing time of erase verification can be reduced also in the present modification example.

Fourth Embodiment

Figure 31:
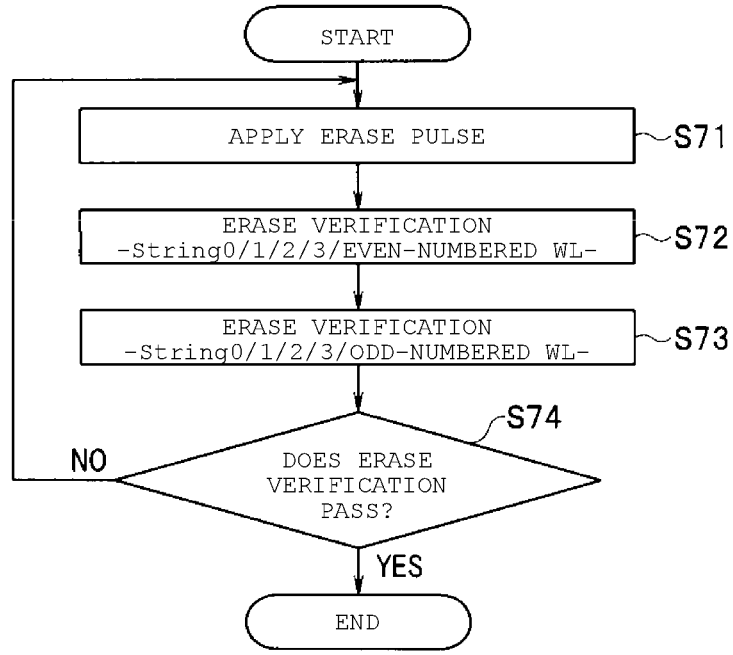
FIG. 31 is a flowchart illustrating an operation flow adopted in a fourth embodiment.

FIG. 31 is a flowchart illustrating an operation flow adopted in a fourth embodiment. A hardware configuration in the present embodiment is identical with the hardware configuration in the first embodiment illustrated in FIGS. 1 to 7.

In the present embodiment, in the same manner as in the third embodiment, when erase verification is performed on the plurality of strings String# at the same time, the erase verification is performed separately for an even-numbered word line and an odd-numbered word line.

In step S71 in FIG. 31, the sequencer 27 controls the voltage generation circuit 28 to generate a high-voltage erase pulse and apply the high-voltage erase pulse to the source line SL. As a result, a charge accumulated in the charge storage film 336 of each memory cell transistor MT of the strings String0 to String3 in the target block BLK is discharged.

Next, in step S72, the sequencer 27 performs erase verification only on the even-numbered word lines of all the strings String0 to String3. As illustrated in FIG. 18, at a time of verifying the even-numbered word line, the erase verification voltage VCG_ER is applied to the even-numbered word line, and the voltage VREAD is applied to the odd-numbered word line.

The sequencer 27 causes the row decoder 25 to apply the voltage VSGS to the select gate transistor ST2 and turn on the select gate transistor ST2, and to apply the voltage VSGD to the select gate transistors ST1 of all the strings String0 to String3 and turn on the select gate transistors ST1. As a result, it is possible to perform the erase verification on the memory cell transistor MT connected to the even-numbered word lines of all the strings String0 to String3.

The sequencer 27 performs the verification preparation process by the sense amplifier 24. In this state, the sense amplifier 24 electrically connects the sense node to the bit line BL under the control of the sequencer 27. As a result, the erase verification for the memory cell transistor MT connected to the even-numbered word lines of all String0 to String3 is executed.

Next, in step S73, the sequencer 27 performs erase verification only on the odd-numbered word lines of all the strings String0 to String3. As illustrated in FIG. 17, at a time of verifying the odd-numbered word line, the erase verification voltage VCG_ER is applied to the odd-numbered word line, and the voltage VREAD is applied to the even-numbered word line.

The sequencer 27 performs the verification preparation process by the sense amplifier 24. In this state, the sense amplifier 24 electrically connects the sense node to the bit line BL under the control of the sequencer 27. As a result, the erase verification for the memory cell transistor MT connected to the odd-numbered word lines of all String0 to String3 is executed.

The sense amplifier 24 outputs the verification result in accordance with the voltage level of the sense node at a predetermined timing to the sequencer 27. In step S74, the sequencer 27 determines whether or not the erase verification passes. When the erase verification fails, the sequencer 27 returns the process to step S71 and repeats erase and erase verification. In this case, the erase verification is performed again only for the odd-numbered word line or the even-numbered word line determined to have an erase fail (erase verification fails) in the previous erase verification.

Other actions are the same as in the third embodiment.

In this manner, in the present embodiment, the erase verification, which is performed for each string String# in the related art, can be performed twice, and the processing time for the erase verification can be reduced.

Modification Example 4-1

Figure 32:
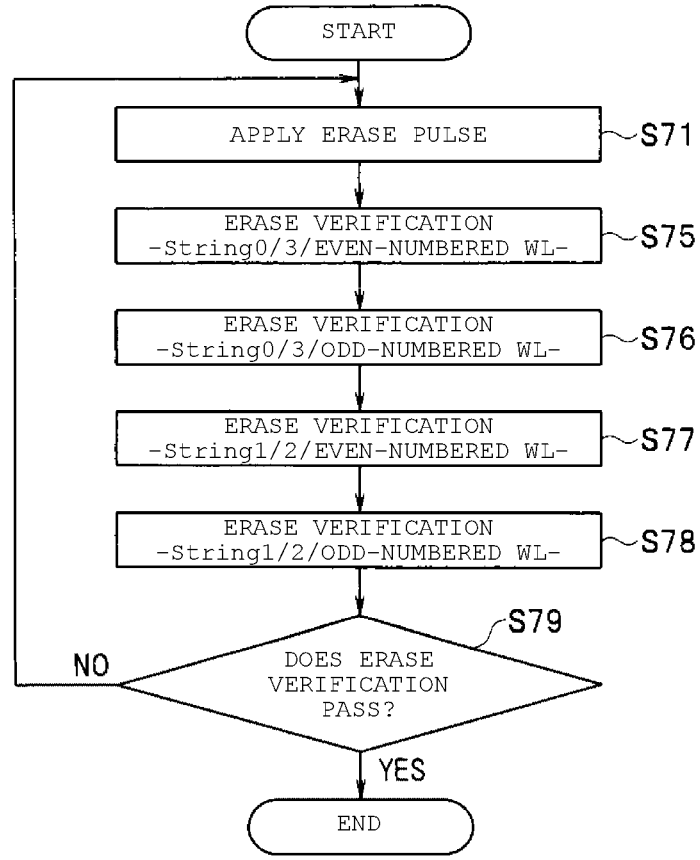
FIG. 32 is a flowchart illustrating aspects of Modification Example 4-1.

FIG. 32 is a flowchart of Modification Example 4-1 of the fourth embodiment. In Modification Example 4-1, steps S75 to S78 are adopted instead of steps S72 and S73 in FIG. 31. In the erase sequence in FIG. 31, an example is described in which verification for even-numbered or odd-numbered word lines is performed simultaneously with respect to all the strings String#. In present Modification Example 4-1, the number of strings String# on which the erase verification is executed at the same time is reduced, verification for the strings String0 and String3 is executed separately for the even-numbered word line and the odd-numbered word line, and verification for the strings String1 and String2 is executed separately for the even-numbered word line and the odd-numbered word line.

That is, in step S75 in FIG. 32, the sequencer 27 causes the row decoder 25 to apply the voltage VSGD to the select gate transistors ST1 of the strings String0 and String3 and turn on the select gate transistors ST1, and to apply the voltage VSS to the gate of each select gate transistor ST1 of the strings String1 and String2 and turn on the select gate transistors ST1. Further, the sequencer 27 applies the erase verification voltage VCG_ER to the even-numbered word line, and applies the voltage VREAD to the odd-numbered word line. As a result, verifications for the even-numbered word lines of the strings String0 and String3 are performed at the same time.

Further, in step S76, the sequencer 27 applies the erase verification voltage VCG_ER to the odd-numbered word line and applies the voltage VREAD to the even-numbered word line. As a result, verifications for the odd-numbered word lines of the strings String0 and String3 are performed at the same time.

In step S77, the sequencer 27 applies the voltage VSGD to the select gate transistors ST1 of the strings String1 and String2 to be turned on, and applies the voltage VSS to the gate of each select gate transistor ST1 of the strings String0 and String3 to be turned off. Further, the sequencer 27 applies the erase verification voltage VCG_ER to the even-numbered word line, and applies the voltage VREAD to the odd-numbered word line. As a result, verifications for the even-numbered word lines of the strings String1 and String2 are performed at the same time.

Further, in step S78, the sequencer 27 applies the erase verification voltage VCG_ER to the odd-numbered word line and applies the voltage VREAD to the even-numbered word line. As a result, verifications for the odd-numbered word lines of the strings String1 and String2 are performed at the same time.

The sense amplifier 24 outputs the erase verification result to the sequencer 27. In step S79, the sequencer 27 determines whether or not erase verifications for all the strings String0 to String3 pass, based on the results of the erase verification in steps S75 to S78. When the erase verification on all of the strings String0 to String3 does not pass, the sequencer 27 returns the process to step S71 and repeats erase and erase verification. In this case, the erase verification is performed again only for the steps determined to have an erase verification fail in the previous verification of steps S75 to S78.

Other actions are the same as in the fourth embodiment.

In this manner, a processing time of erase verification can be reduced also in the present modification example.

Modification Example 4-2

Figure 33:
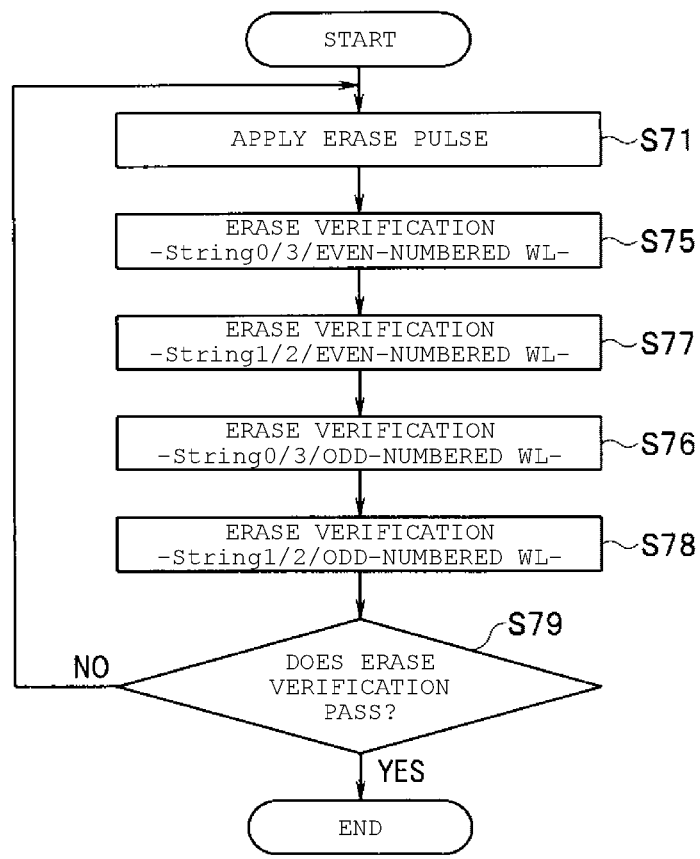
FIG. 33 is a flowchart illustrating aspects of Modification Example 4-2.

FIG. 33 is a flowchart of Modification Example 4-2 of the fourth embodiment. Also in Modification Example 4-1 in FIG. 32, the combination of the strings String# and the order of the processes can be appropriately set in the same manner as each of the above examples. In Modification Example 4-2, the order of steps S76 and S77 in FIG. 32 is changed.

That is, in step S75 in FIG. 33, the sequencer 27 applies the voltage VSGD to the select gate transistors ST1 of the strings String0 and String3 to be turned on, and applies the voltage VSS to the gate of each select gate transistors ST1 of the strings String1 and String2 to be turned off. Further, the sequencer 27 applies the erase verification voltage VCG_ER to the even-numbered word line, and applies the voltage VREAD to the odd-numbered word line. As a result, verifications for the even-numbered word lines of the strings String0 and String3 are performed at the same time.

In next step S77, the sequencer 27 applies the voltage VSGD to the select gate transistors ST1 of the strings String1 and String2 to be turned on, and applies the voltage VSS to the gate of each select gate transistor ST1 of the strings String0 and String3 to be turned off. As a result, verifications for the even-numbered word lines of the strings String1 and String2 are performed at the same time.

In next step S76, the sequencer 27 applies the voltage VSGD to the select gate transistors ST1 of the strings String0 and String3 to be turned on, and applies the voltage VSS to the gate of each select gate transistor ST1 of the strings String1 and String2 to be turned off. Further, the sequencer 27 applies the erase verification voltage VCG_ER to the odd-numbered word line, and applies the voltage VREAD to the even-numbered word line. As a result, verifications for the odd-numbered word lines of the strings String0 and String3 are performed at the same time.

In next step S78, the sequencer 27 applies the voltage VSGD to the select gate transistors ST1 of the strings String1 and String2 to be turned on, and applies the voltage VSS to the gate of each select gate transistor ST1 of the strings String0 and String3 to be turned off. As a result, verifications for the odd-numbered word lines of the strings String1 and String2 are performed at the same time.

Other actions are the same as in Modification Example 4-1. It is clear that step S76 and step S78 in FIG. 33 may be interchanged.

In this manner, a processing time of erase verification can be reduced also in the present modification example.

Modification Example 1-4

Figure 34:
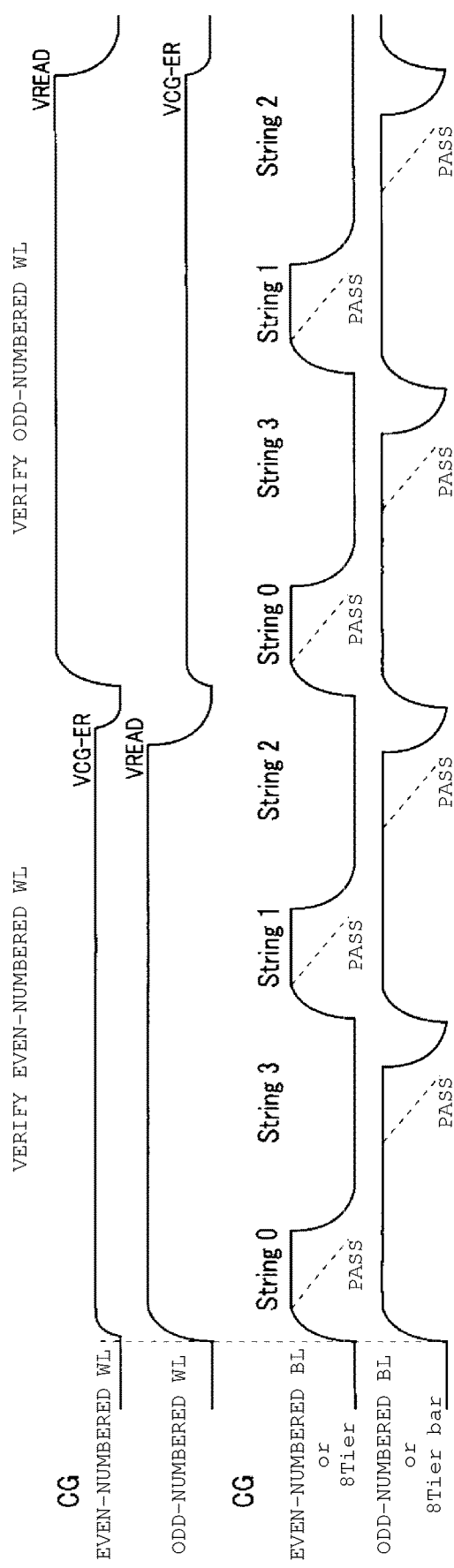
FIG. 34 is a waveform diagram illustrating aspects related to Modification Example 1-4.

FIG. 34 is a waveform diagram illustrating Modification Example 1-4 of the first embodiment, and illustrates a voltage change of the sense node by a description identical with FIG. 19. In Modification Example 1-4, the method of the first embodiment is applied to each set including the strings String# in Modification Examples 4-1 and 4-2. FIG. 34 illustrates an example in which the method is applied to FIG. 33.

In present Modification Example, an example in which a string unit is divided into 16 Tiers, and erase verification is separately executed on the 8 Tiers and the remaining 8 Tiers (8 Tiers bar), and the erase verification is performed on a set including the strings String0 and String3 and a set including the strings String1 and String2 and further performed separately for an even-numbered word line and an odd-numbered word line is described. A verification order or the like for the set including the strings String# for the even-numbered word line and the odd-numbered word line can be changed as appropriate. As described in the first embodiment, the 8 Tiers and the 8 Tiers bar correspond to the bit lines BL different from each other, and may be respectively, for example, the even-numbered bit line BL and the odd-numbered bit line BL.

In the example in FIG. 34, the sequencer 27 first generates a high-voltage erase pulse and applies the high-voltage erase pulse to the source line SL. As a result, a charge accumulated in the charge storage film 336 of each memory cell transistor MT of the strings String0 to String3 in the target block BLK is discharged.

Next, the sequencer 27 performs erase verification. In this case, the sequencer 27 applies the voltage VSGD to the select gate transistor ST1 of the string String0 to be turned on, and applies the voltage VSS to the gate of each select gate transistor ST1 of the other strings String1 to String3 to be turned off. Further, the erase verification voltage VCG_ER is applied to the even-numbered word line, and the voltage VERD is applied to the odd-numbered word line. As a result, it is possible to perform the erase verification on only the even-numbered word line of the string String0.

Further, the sequencer 27 performs the verification preparation process by the sense amplifier 24. That is, as illustrated in FIG. 34, the bit line BL and the sense node are charged in all the Tiers. In this state, the sense amplifier 24 electrically connects the sense node connected to the bit line BL belonging to the 8 Tiers to the bit line BL under the control of the sequencer 27.

As a result, the voltage of the corresponding sense node changes according to the threshold voltage of the memory cell transistor MT connected to the even-numbered word line of String0 corresponding to the 8 Tiers, and erase verification is performed.

Next, the sequencer 27 applies the voltage VSGD to the select gate transistor ST1 of the string String3 to be turned on, and applies the voltage VSS to the gate of each select gate transistor ST1 of the other strings String0 to String2. As a result, it is possible to perform the erase verification on only the even-numbered word line of the string String3. At this point, the bit line BL and the sense node belonging to the 8 Tiers bar are not discharged, so there is no need to recharge the bit line BL and the sense node. In this state, the sense amplifier 24 electrically connects the sense node connected to the bit line BL belonging to the 8 Tiers bar to the bit line BL under the control of the sequencer 27. As a result, the voltage of the corresponding sense node changes according to the threshold voltage of the memory cell transistor MT connected to the even-numbered word line of the string String3 corresponding to the 8 Tiers bar, and erase verification is performed.

In the same manner, the sequencer 27 causes the sense amplifier 24 to execute the verification preparation process, and electrically connect the sense node connected to the bit line BL belonging to the 8 Tiers to the bit line BL, in a state in which the erase verification can be performed only for the even-numbered word line of the string String1. As a result, the voltage of the corresponding sense node changes according to the threshold voltage of the memory cell transistor MT of the even-numbered word line of the string String1 corresponding to the 8 Tiers, and erase verification is performed.

Next, the sequencer 27 electrically connects the sense node connected to the bit line BL belonging to the 8 Tiers bar to the bit line BL in a state in which the erase verification can be performed only for the even-numbered word line of the string String1. As a result, the voltage of the corresponding sense node changes according to the threshold voltage of the memory cell transistor MT of the even-numbered word line of String1 corresponding to the 8 Tiers bar, and erase verification is performed.

In the same manner below, the sequencer 27 performs the erase verification on the odd-numbered word lines in the order of String0, String3, String1, and String1.

Other actions are the same as in the first embodiment.

In this manner, a processing time of erase verification can be reduced also in the present modification example.

Fifth Embodiment

Figure 35:
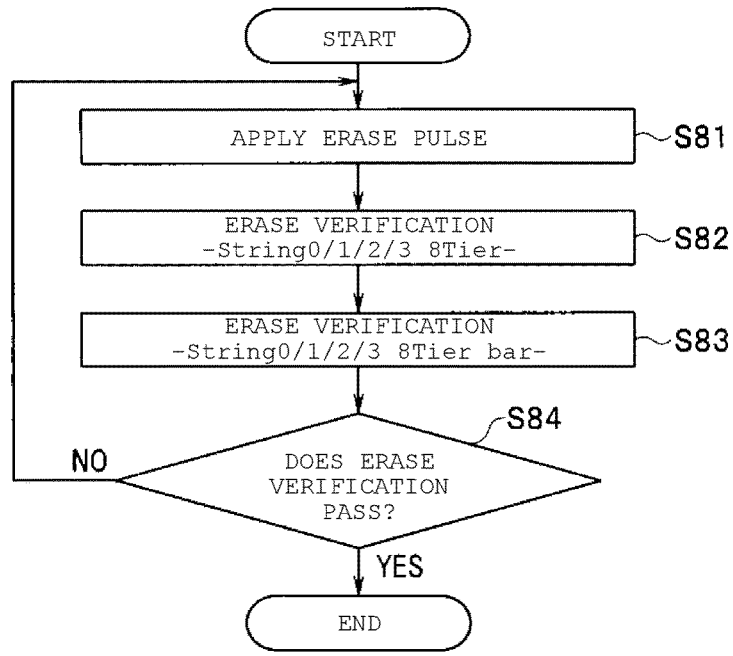
FIG. 35 is a flowchart illustrating an operation flow adopted in a fifth embodiment.

FIG. 35 is a flowchart illustrating an operation flow adopted in a fifth embodiment. A hardware configuration in the fifth embodiment is identical with the hardware configuration in the first embodiment illustrated in FIGS. 1 to 7.

In the fifth embodiment, in the same manner as in the third embodiment, when erase verification is performed on a plurality of strings String# at the same time, the erase verification is performed separately for each Tier, for example, 8 Tiers and 8 Tiers bars.

In step S81 in FIG. 35, the sequencer 27 controls the voltage generation circuit 28 to generate a high-voltage erase pulse and apply the high-voltage erase pulse to the source line SL. As a result, a charge accumulated in the charge storage film 336 of each memory cell transistor MT of the strings String0 to String3 in the target block BLK is discharged.

Next, in step S82, the sequencer 27 executes erase verification for 8 Tiers of all the strings String0 to String3. That is, the sequencer 27 applies the voltage VSGD to all the select gate transistors ST1 of the strings String0 to String3 to be turned on. As a result, it is possible to perform the erase verification for all the strings String0 to String3.

The sequencer 27 performs the verification preparation process by the sense amplifier 24. In this state, the sense amplifier 24 electrically connects the sense node connected to the bit line BL belonging to the 8 Tiers to the bit line BL under the control of the sequencer 27. As a result, the erase verification is performed on the memory cell transistor MT connected to the bit line BL belonging to 8 Tiers of all String0 to String3.

Next, in step S83, the sequencer 27 performs the erase verification for 8 Tiers bars of all the strings String0 to String3. The sequencer 27 performs the verification preparation process by the sense amplifier 24. In this state, the sense amplifier 24 electrically connects the sense node connected to the bit line BL belonging to the 8 Tiers bar to the bit line BL under the control of the sequencer 27. As a result, the erase verification is performed on the memory cell transistor MT connected to the bit line BL belonging to 8 Tiers bar of all String0 to String3.

The sense amplifier 24 outputs the verification result to the sequencer 27. In step S84, the sequencer 27 determines whether or not the erase verification passes. When the erase verification fails, the sequencer 27 returns the process to step S81 and repeats erase and erase verification. In this case, the erase verification is performed again only for the one of the 8 Tiers or the 8 Tiers bar determined to have an erase fail (erase verification fails) in the previous erase verification.

Other actions are the same as in the third embodiment.

In this manner, in the present embodiment, the second erase verification, which would be performed for every memory string in the related art, can be performed on just half the memory strings, and the processing time for the erase verification can be reduced. Modification Example 5-1

Figure 36:
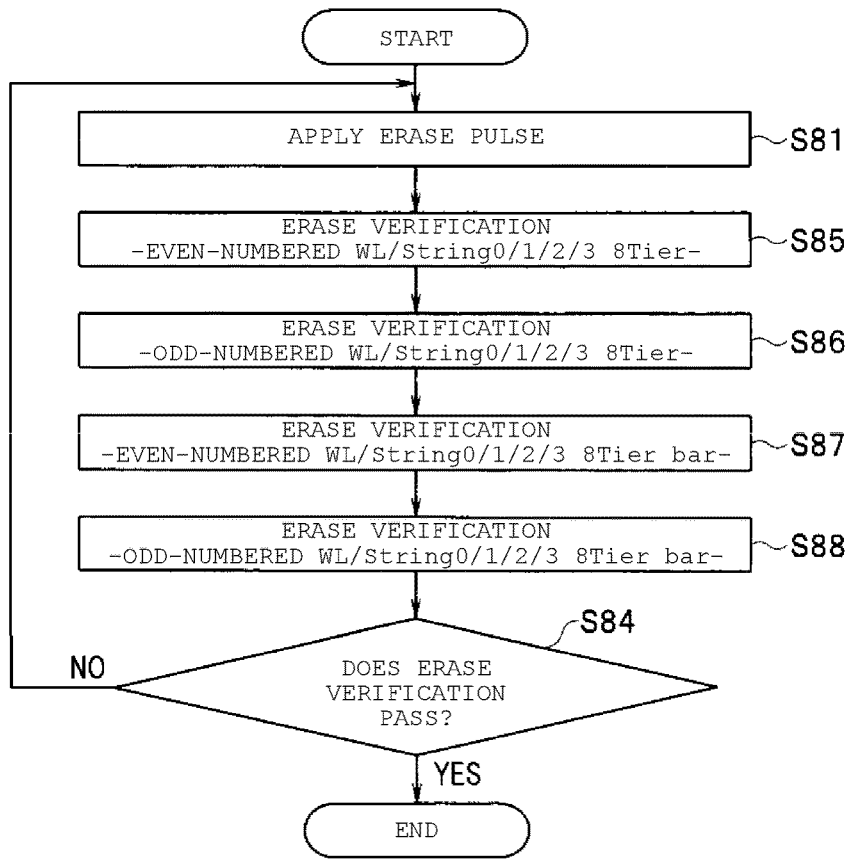
FIG. 36 is a flowchart illustrating aspects of Modification Example 5-1.

FIG. 36 is a flowchart of Modification Example 5-1 of a fifth embodiment. In Modification Example 5-1, steps S85 to S88 are adopted instead of steps S82 and S83 in FIG. 35. In the erase sequence in FIG. 35, an example is described in which erase verifications are simultaneously executed on the memory cell transistors MT belonging to the 8 Tiers or the 8 Tiers bars for all the strings. In present Modification Example 5-1, an example in which the erase verifications in steps S82 and S83 are further divided into even-numbered or odd-numbered word lines and executed.

That is, in step S85 in FIG. 36, the sequencer 27 causes the row decoder 25 to apply the voltage VSGD to the select gate transistors ST1 of all the strings String0 to String3 to be turned on. Further, the sequencer 27 applies the erase verification voltage VCG_ER to the even-numbered word line, and applies the voltage VREAD to the odd-numbered word line. As a result, the even-numbered word lines of all the strings String0 to String3 can be verified at the same time. Further, the sequencer 27 performs the verification preparation process by the sense amplifier 24. In this state, the sense amplifier 24 electrically connects the sense nodes connected to the bit lines BL belonging to the 8 Tiers to the bit line BL under the control of the sequencer 27. As a result, the erase verification is performed on the memory cell transistor MT connected to the bit line BL belonging to the 8 Tiers of the memory cell transistors MT connected to the even-numbered word lines of all String0 to String3.

In next step S86, the sequencer 27 applies the erase verification voltage VCG_ER to the odd-numbered word line and applies the voltage VREAD to the even-numbered word line. Further, the sequencer 27 performs the verification preparation process by the sense amplifier 24. In this state, the sense amplifier 24 electrically connects the sense node connected to the bit line BL belonging to the 8 Tiers to the bit line BL under the control of the sequencer 27. As a result, the erase verification is performed on the memory cell transistor MT connected to the bit line BL belonging to the 8 Tiers of the memory cell transistors MT connected to the odd-numbered word lines of all the strings String0 to String3.

In step S87, the sequencer 27 applies the erase verification voltage VCG_ER to the even-numbered word line, and applies the voltage VREAD to the odd-numbered word line. Further, the sequencer 27 performs the verification preparation process by the sense amplifier 24. In this state, the sense amplifier 24 electrically connects the sense node connected to the bit line BL belonging to the 8 Tiers bar to the bit line BL under the control of the sequencer 27. As a result, the erase verification is performed on the memory cell transistor MT connected to the bit line BL belonging to the 8 Tiers bar of the memory cell transistors MT connected to the even-numbered word lines of all the strings String0 to String3.

Next, in step S88, the sequencer 27 applies the erase verification voltage VCG_ER to the odd-numbered word line and applies the voltage VREAD to the even-numbered word line. Further, the sequencer 27 performs the verification preparation process by the sense amplifier 24. In this state, the sense amplifier 24 electrically connects the sense node connected to the bit line BL belonging to the 8 Tiers bar to the bit line BL under the control of the sequencer 27. As a result, the erase verification is performed on the memory cell transistor MT connected to the bit line BL belonging to the 8 Tiers bar of the memory cell transistors MT connected to the odd-numbered word lines of all the strings String0 to String3.

Other actions are the same as in the fifth embodiment.

In this manner, a processing time of erase verification can be reduced also in the present modification example.

Modification Example 5-2

Figure 37:
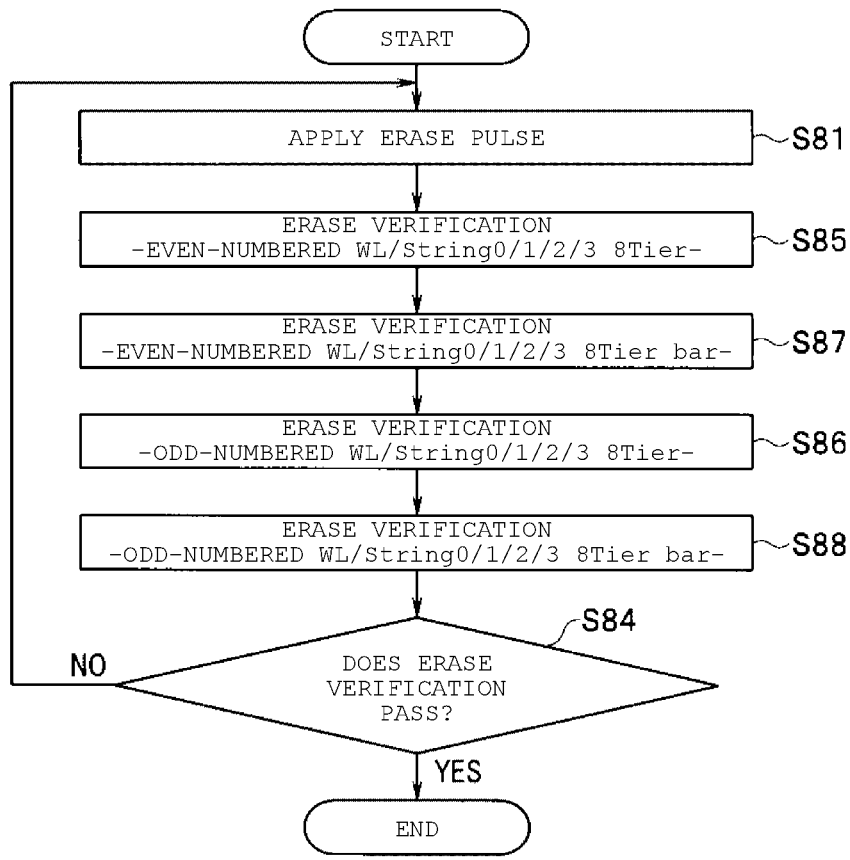
FIG. 37 is a flowchart illustrating aspects of Modification Example 5-2.

FIG. 37 is a flowchart of Modification Example 5-2 of the fifth embodiment. Also in Modification Example 5-1 in FIG. 36, the combination of the strings and the order of the processes can be appropriately set in the same manner as each of the above examples. In Modification Example 5-2, the order of steps S86 and S87 in FIG. 36 is changed.

That is, in step S85 in FIG. 37, the sequencer 27 applies the voltage VSGD to the select gate transistor ST1 of all the strings String0 to String3 to be turned on. Further, the sequencer 27 applies the erase verification voltage VCG_ER to the even-numbered word line, and applies the voltage VREAD to the odd-numbered word line. Further, the sequencer 27 performs the verification preparation process by the sense amplifier 24. In this state, the sense amplifier 24 electrically connects the sense node connected to the bit line BL belonging to the 8 Tiers to the bit line BL under the control of the sequencer 27. As a result, the erase verification is performed on the memory cell transistor MT connected to the bit line BL belonging to the 8 Tiers of the memory cell transistors MT connected to the even-numbered word lines of all String0 to String3.

In next step S87, the sequencer 27 performs the verification preparation process by the sense amplifier 24. In this state, the sense amplifier 24 electrically connects the sense node connected to the bit line BL belonging to the 8 Tiers bar to the bit line BL under the control of the sequencer 27. As a result, the erase verification is performed on the memory cell transistor MT connected to the bit line BL belonging to the 8 Tiers bar of the memory cell transistors MT connected to the even-numbered word lines of all the strings String0 to String3.

In next step S86, the sequencer 27 applies the erase verification voltage VCG_ER to the odd-numbered word line and applies the voltage VREAD to the even-numbered word line. Further, the sequencer 27 performs the verification preparation process by the sense amplifier 24. In this state, the sense amplifier 24 electrically connects the sense node connected to the bit line BL belonging to the 8 Tiers to the bit line BL under the control of the sequencer 27. As a result, the erase verification is performed on the memory cell transistor MT connected to the bit line BL belonging to the 8 Tiers of the memory cell transistors MT connected to the odd-numbered word lines of all the strings String0 to String3.

Other actions are the same as in Modification Example 5-1. It is clear that step S86 and step S88 in FIG. 37 may be interchanged.

In this manner, a processing time of erase verification can be reduced also in the present modification example.

Modification Example 5-3

Figure 38:
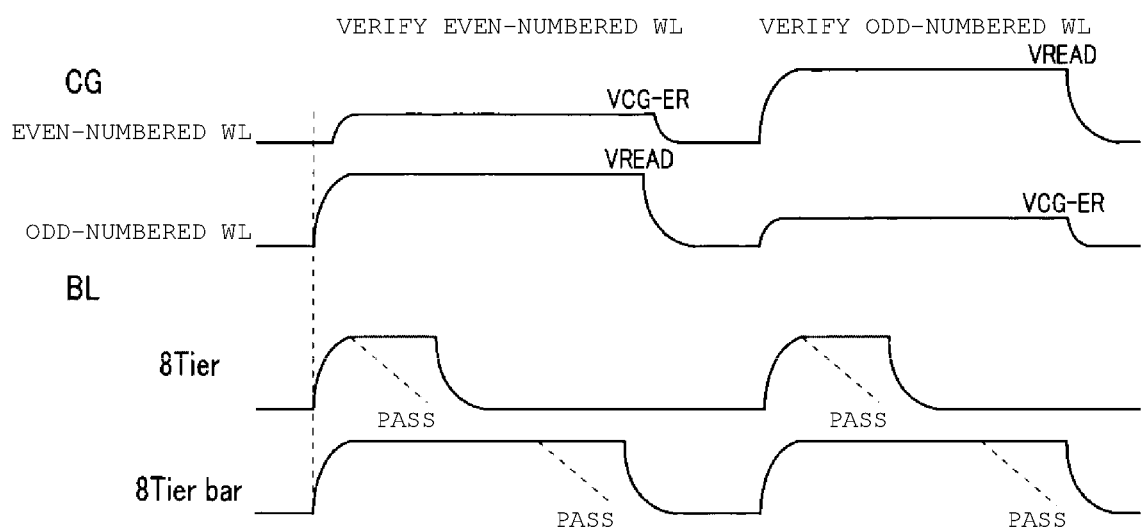
FIG. 38 is a waveform diagram illustrating aspects related to Modification Example 5-3.

FIG. 38 is a waveform diagram illustrating Modification Example 5-3 of the fifth embodiment, and illustrates a voltage change of the sense node by a description identical with FIG. 19. Modification Example 5-3 is obtained by applying the method of the first embodiment to the examples of FIGS. 35 to 37. FIG. 38 illustrates an example in which the method is applied to FIG. 37.

In each step S85 to S88 in FIG. 37, the verification preparation process is executed when erase verification is performed. Meanwhile, when the method of the first embodiment is applied, it is not necessary to execute the verification preparation process when the erase verification is performed in steps S86 and S88.

In step S85, the sequencer 27 performs the verification preparation process by the sense amplifier 24. That is, as illustrated in FIG. 38, the sense node connected to the bit line BL is charged at all Tiers. In this state, the sense amplifier 24 electrically connects the sense node connected to the bit line BL belonging to the 8 Tiers to the bit line BL under the control of the sequencer 27. As a result, the erase verification is executed on the memory cell transistor MT connected to the bit line BL corresponding to 8 Tiers among the memory cell transistors MT connected to the even-numbered word lines of String0 to String3.

In next step S87, the sequencer 27 electrically connects the sense node connected to the bit line BL belonging to the 8 Tiers bar to the bit line BL, by the sense amplifier 24. As a result, the erase verification is performed on the memory cell transistor MT connected to the bit line BL belonging to 8 Tiers bar among the memory cell transistors MT connected to the even-numbered word lines of String0 to String3.

In next step S86, the sequencer 27 applies the erase verification voltage VCG_ER to the odd-numbered word line and applies the voltage VREAD to the even-numbered word line. Further, the sequencer 27 performs the verification preparation process by the sense amplifier 24. In this state, the sense amplifier 24 electrically connects the sense node connected to the bit line BL belonging to the 8 Tiers to the bit line BL under the control of the sequencer 27. As a result, the erase verification is performed on the memory cell transistor MT connected to the bit line BL belonging to the 8 Tiers of the memory cell transistors MT connected to the odd-numbered word lines of all the strings String0 to String3.

In next step S88, the sequencer 27 electrically connects the sense node connected to the bit line BL belonging to the 8 Tiers bar to the bit line BL, by the sense amplifier 24. As a result, the erase verification is performed on the memory cell transistor MT connected to the bit line BL belonging to 8 Tiers bar among the memory cell transistors MT connected to the odd-numbered word lines of String0 to String3.

Other actions are the same as in the fifth embodiment.

In this manner, a processing time of erase verification can be reduced also in the present modification example.

Sixth Embodiment

Figure 39:
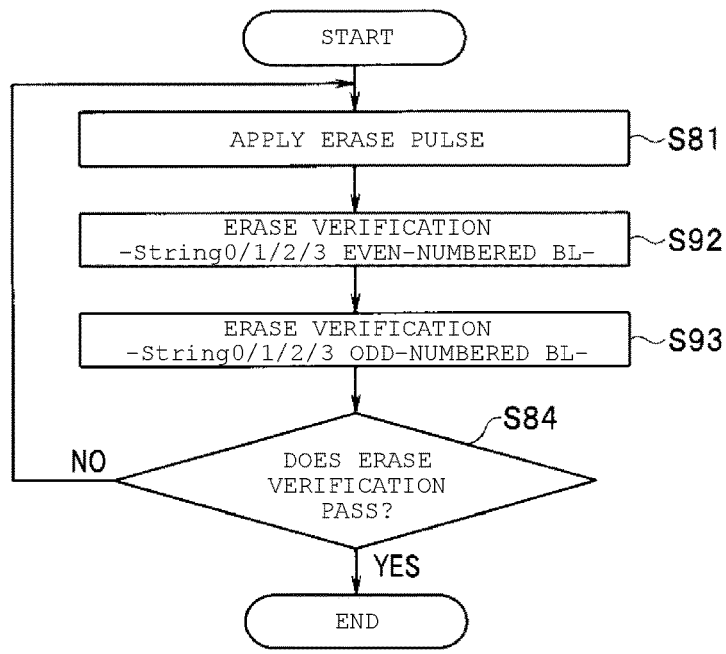
FIG. 39 is a flowchart illustrating an operation flow adopted in a sixth embodiment.

FIG. 39 is a flowchart illustrating an operation flow adopted in a sixth embodiment. A hardware configuration in the present embodiment is identical with the hardware configuration in the first embodiment illustrated in FIGS. 1 to 7.

In the present embodiment, in the same manner as the fifth embodiment, erase verifications are separately performed on different sets including the bit lines BL, for example, the even-numbered bit line BL and the odd-numbered bit line BL.

FIG. 39 is different from FIG. 35 in that steps S92 and S93 are adopted instead of steps S82 and S83. Steps S92 and S93 are different from steps S82 and S83 in FIG. 35 in that the even-numbered bit line BL and the odd-numbered bit line BL are respectively used instead of 8 Tiers and 8 Tiers bars. That is, the sixth embodiment can be explained by replacing the 8 Tiers with the even-numbered bit line BL and replacing the 8 Tiers bar with the odd-numbered bit line BL in the description of the fifth embodiment in FIG. 35, and additional description will be omitted.

In this manner, the erase verification can be performed twice, but the second erase verification need only be performed on one-half of the strings instead of all the strings as in the related art, and the processing time for the erase verification can be reduced.

Modification Example 6-1

Figure 40:
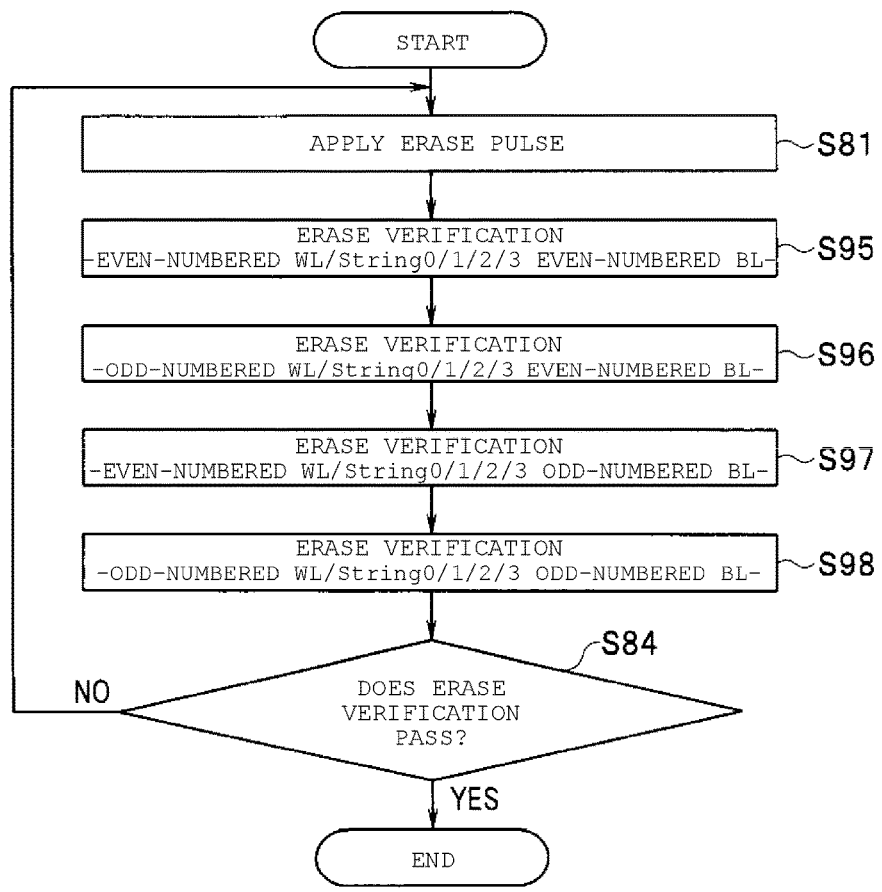
FIG. 40 is a flowchart illustrating aspects of Modification Example 6-1.

FIG. 40 is a flowchart of Modification Example 6-1 of the sixth embodiment. In Modification Example 6-1, steps S95 to S98 are respectively adopted instead of steps S85 to S88 in FIG. 36. Steps S95 to S98 are different from steps S85 to S88 in FIG. 36 in that the even-numbered bit line BL and the odd-numbered bit line BL are respectively used instead of 8 Tiers and 8 Tiers bars. That is, Modification Example 6-1 can be explained by replacing the 8 Tiers with the even-numbered bit line BL and replacing the 8 Tiers bar with the odd-numbered bit line BL in the description of Modification Example 5-1 of the fifth embodiment in FIG. 36, and additional description will be omitted.

In this manner, a processing time of erase verification can be reduced also in the present modification example.

Modification Example 6-2

Figure 41:
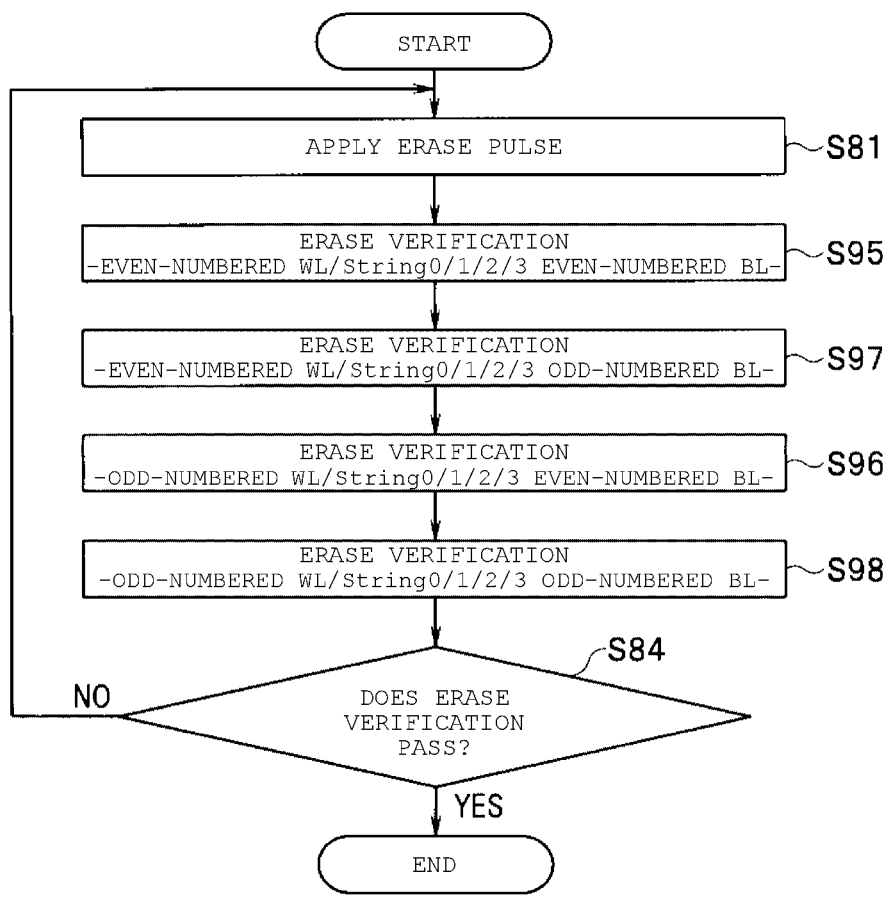
FIG. 41 is a flowchart illustrating aspects of Modification Example 6-2.

FIG. 41 is a flowchart of Modification Example 6-2 of the sixth embodiment. In Modification Example 6-2 in FIG. 41, steps S95 to S98 are respectively adopted instead of steps S85 to S88 in FIG. 37. That is, Modification Example 6-2 can be explained by replacing the 8 Tiers with the even-numbered bit line BL and replacing the 8 Tiers bar with the odd-numbered bit line BL in the description of Modification Example 5-2 of the fifth embodiment in FIG. 37, and additional description will be omitted.

In this manner, a processing time of erase verification can be reduced also in the present modification example.

Modification Example 6-3

Figure 42:
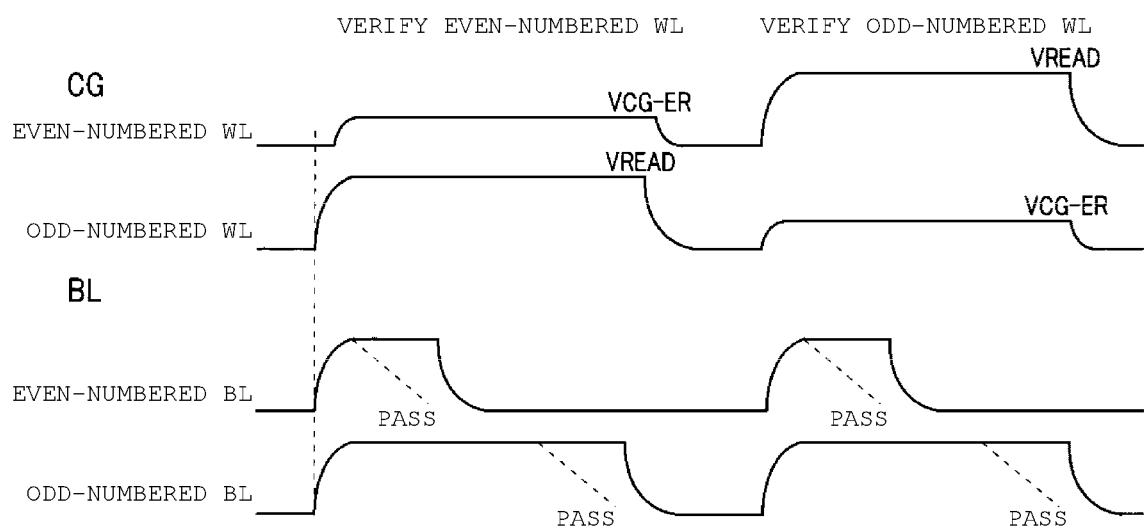
FIG. 42 is a waveform diagram illustrating aspects related to Modification Example 6-3.

FIG. 42 is a waveform diagram illustrating the modification example 6-3 of the sixth embodiment, and illustrates a voltage change of the sense node by a description identical with FIG. 19. Modification Example 6-3 is obtained by applying the method of the first embodiment to the examples of FIGS. 39 to 41. FIG. 42 illustrates an example in which the method is applied to FIG. 41. That is, Modification Example 6-3 can be explained by replacing the 8 Tiers with the even-numbered bit line BL and replacing the 8 Tiers bar with the odd-numbered bit line BL in the description of Modification Example 5-3 of the fifth embodiment in FIG. 38, and additional description will be omitted.

In this manner, a processing time of erase verification can be reduced also in the present modification example.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
   a memory block that includes a plurality of string units including memory strings comprising memory cell transistors connected in series;
   a plurality of word lines, memory cell transistors in a same row of each of the memory strings being connected to a respective word line in the plurality of word lines;
   a plurality of bit lines each respectively connected to one of the memory strings in each string unit, the plurality of bit lines being divided into a plurality of bit line groups;
   a sense amplifier connected to the plurality of bit lines; and
   a control circuit configured to perform an erasing operation on all of the plurality of memory cell transistors in the memory block, wherein
   when an erase verification of the erasing operation is performed on a memory cell transistor, the control circuit is configured to execute the erase verification on only a subset of memory strings in each string unit of the memory block, and
   the sense amplifier is configured to execute a verification preparation process including a charging process at a start of the erase verification, and to omit the verification preparation process when switching from one string unit to another string unit to be verified after the start of the erase verification.

2. The semiconductor memory device according to claim 1, wherein the subset of memory strings in each string unit is connected to a different bit line group in the plurality of bit line groups.

3. The semiconductor memory device according to claim 1, wherein the control circuit is configured to execute the erase verification using only one bit line group per string unit.

4. The semiconductor memory device according to claim 1, wherein the control circuit is configured to separately execute erase verification for even-numbered word lines and for odd-numbered word lines.

5. The semiconductor memory device according to claim 1, wherein the bit lines in the same bit line group are adjacent to another bit line in the same bit line group.

6. The semiconductor memory device according to claim 1, wherein the bit lines in the same bit line group include bit lines that are not adjacent to any other bit line in the same bit line group.

7. The semiconductor memory device according to claim 1, wherein the memory cell transistors are NAND flash-type memory cell transistors.

8. A semiconductor memory device, comprising:
   a memory block that includes a plurality of string units including memory strings comprising memory cell transistors connected in series;
   a plurality of word lines, memory cell transistors in a same row of each of the memory strings being connected to a respective word line in the plurality of word lines;
   a plurality of bit lines each respectively connected to one of the memory strings in each string unit and being divided into a plurality of bit line groups;
   a sense amplifier connected to the plurality of bit lines; and
   a control circuit configured to perform an erasing operation on all of the plurality of memory cell transistors in the memory block, wherein
   when an erase verification is performed on the memory cell transistors, the control circuit is configured to simultaneously execute the erase verification on memory cell transistors in two or more string units among the plurality of string units in the memory block, and
   the sense amplifier is configured to execute a verification preparation process including a charging process at a start of the erase verification, and to omit the verification preparation process when switching from one set of memory strings to another set of memory strings to be verified.

9. The semiconductor memory device according to claim 8, wherein the control circuit is configured to separately execute erase verification for even-numbered word lines and for odd-numbered word lines.

10. The semiconductor memory device according to claim 9, wherein the control circuit is configured to execute the erase verification using only one bit line group of the plurality of bit line groups per string unit.

11. The semiconductor memory device according to claim 8, wherein the one set of memory strings includes only even-numbered bit lines and the another set of memory strings includes only odd-numbered bit lines.

12. The semiconductor memory device according to claim 8, wherein the memory cell transistors are NAND flash-type memory cell transistors.

* * * * *